US008350289B2

(12) United States Patent
Tsukuda

(10) Patent No.: US 8,350,289 B2
(45) Date of Patent: Jan. 8, 2013

(54) SEMICONDUCTOR DEVICE

(75) Inventor: Masanori Tsukuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 327 days.

(21) Appl. No.: 12/545,628

(22) Filed: Aug. 21, 2009

(65) Prior Publication Data

US 2010/0096664 A1 Apr. 22, 2010

(30) Foreign Application Priority Data

Oct. 17, 2008 (JP) ................................. 2008-269069

(51) Int. Cl.
*H01L 29/66* (2006.01)

(52) U.S. Cl. ................ 257/139; 257/655; 257/E29.197; 257/E29.327; 257/E31.008; 438/48; 438/84; 438/89; 438/98

(58) Field of Classification Search .................... 438/84, 438/48, 89, 98; 257/139, 655–656, E29.336, 257/E29.197, E29.327, E31.008, E21.159, 257/42, 77
See application file for complete search history.

(56) References Cited

U.S. PATENT DOCUMENTS 4,199,771 A * 4/1980 Nishizawa et al. ........... 257/264
5,162,876 A * 11/1992 Kitagawa et al. ............. 257/138
5,168,333 A * 12/1992 Nakagawa et al. ........... 257/135
5,343,067 A * 8/1994 Nakagawa et al. ........... 257/487
5,396,087 A * 3/1995 Baliga ........................... 257/139
5,438,220 A * 8/1995 Nakagawa et al. ........... 257/487
5,464,994 A * 11/1995 Shinohe et al. ............... 257/147
5,559,361 A * 9/1996 Pezzani ......................... 257/546
5,631,181 A * 5/1997 Pezzani ......................... 438/106
5,708,286 A * 1/1998 Uesugi et al. ................. 257/330
5,828,101 A * 10/1998 Endo ............................. 257/330
5,912,497 A * 6/1999 Baliga ........................... 257/366
6,049,109 A * 4/2000 Omura et al. ................. 257/347
6,072,215 A * 6/2000 Kawaji et al. ................. 257/334
6,075,259 A * 6/2000 Baliga ............................. 257/77
6,111,289 A * 8/2000 Udrea ........................... 257/328
6,133,607 A * 10/2000 Funaki et al. ................. 257/343
6,169,299 B1 * 1/2001 Kawaji et al. ................. 257/137
6,218,683 B1 * 4/2001 Koga et al. .................... 257/156
6,303,954 B1 * 10/2001 Ohoka .......................... 257/296
6,307,232 B1 * 10/2001 Akiyama et al. .............. 257/347
6,410,950 B1 * 6/2002 Sittig et al. .................... 257/267
6,465,874 B2 * 10/2002 Nemoto ........................ 257/653
6,531,738 B1 * 3/2003 Uemoto et al. ............... 257/347
6,603,189 B2 * 8/2003 Takahashi ..................... 257/617
6,639,295 B2 * 10/2003 Majumdar et al. ............ 257/506
(Continued)

FOREIGN PATENT DOCUMENTS

JP 411026780 * 1/1999
(Continued)

*Primary Examiner* — N Drew Richards
*Assistant Examiner* — Ankush Singal
(74) *Attorney, Agent, or Firm* — Patterson & Sheridan, LLP

(57) ABSTRACT

A semiconductor device includes: a first semiconductor layer; a first electrode provided on a first surface side of the first semiconductor layer; a first insulating layer; and a second semiconductor layer. The first insulating layer is provided between the first semiconductor layer and the first electrode and configured to constrict current flowing between the first semiconductor layer and the first electrode. The second semiconductor layer has a first conductivity type and is provided at least on a path of the current constricted by the first insulating layer. The second semiconductor layer is in contact with the first electrode. The second semiconductor layer contains first impurities at a concentration higher than a concentration of impurities contained in the first semiconductor layer.

21 Claims, 18 Drawing Sheets

U.S. PATENT DOCUMENTS 6,653,175 B1 * 11/2003 Nemati et al. ................ 438/133
6,690,085 B2 * 2/2004 Nakagawa et al. ........... 257/656
6,822,313 B2 * 11/2004 Matsushita ................... 257/544
6,870,199 B1 * 3/2005 Yoshikawa et al. ........... 257/131
6,894,347 B2 * 5/2005 Hattori et al. ................. 257/330
6,909,149 B2 * 6/2005 Russ et al. .................... 257/355
6,921,945 B2 * 7/2005 Terashima .................... 257/347
6,972,469 B2 * 12/2005 Peichl et al. .................. 257/458
6,979,874 B2 * 12/2005 Harada ......................... 257/475
7,005,725 B2 * 2/2006 Poveda ......................... 257/656
7,358,127 B2 * 4/2008 Nemoto ........................ 438/197
7,417,296 B2 * 8/2008 Akiyama ...................... 257/500
7,432,135 B2 * 10/2008 Takahashi ..................... 438/140
7,456,484 B2 * 11/2008 Ozeki et al. ................... 257/506
7,470,956 B2 * 12/2008 Takahashi ..................... 257/347
7,492,034 B2 * 2/2009 Pfirsch .......................... 257/591
7,569,914 B2 * 8/2009 Yamazaki et al. ............ 257/655
7,622,752 B2 * 11/2009 Lanois et al. ................ 257/109
7,635,892 B2 * 12/2009 Tokuda et al. ................ 257/328
7,649,212 B2 * 1/2010 Morand ........................ 257/107
RE41,368 E * 6/2010 Uemoto et al. ............... 257/347
7,799,667 B2 * 9/2010 Shiraki et al. ................. 438/589
7,858,449 B2 * 12/2010 Yang et al. .................... 438/133
2001/0013573 A1 * 8/2001 Fujino ....................... 250/214 A
2001/0015445 A1 * 8/2001 Nemoto ........................ 257/138
2002/0020893 A1 * 2/2002 Lhorte .......................... 257/481
2002/0140054 A1 * 10/2002 Matsushita ................... 257/546
2003/0062584 A1 * 4/2003 Takahashi ..................... 257/458
2004/0135235 A1 * 7/2004 Poveda ......................... 257/656
2005/0048701 A1 * 3/2005 Minato et al. ................. 438/135
2005/0073030 A1 * 4/2005 Inoue et al. ................... 257/656
2005/0116284 A1 * 6/2005 Chen ............................ 257/329
2005/0127434 A1 * 6/2005 Quoirin et al. ................ 257/327
2005/0133887 A1 * 6/2005 Ducreux ....................... 257/608
2005/0230686 A1 * 10/2005 Kojima et al. .................. 257/77
2006/0043475 A1 * 3/2006 Terashima .................... 257/335
2006/0081923 A1 * 4/2006 Mauder et al. ................ 257/335
2006/0231867 A1 * 10/2006 Takahashi ..................... 257/216
2006/0244004 A1 * 11/2006 Morand ........................ 257/107
2006/0261346 A1 * 11/2006 Ryu et al. ........................ 257/77
2006/0267129 A1 * 11/2006 Inoue et al. ................... 257/471
2007/0058426 A1 * 3/2007 Sokolik et al. ................ 365/174
2007/0111356 A1 * 5/2007 Wilson et al. .................. 438/48
2007/0158680 A1 * 7/2007 Ozeki et al. ................... 257/146
2007/0200138 A1 * 8/2007 Ozeki et al. ................... 257/139
2007/0210328 A1 * 9/2007 Sheu ............................ 257/107
2008/0135871 A1 * 6/2008 Ruething et al. .............. 257/139
2008/0290443 A1 * 11/2008 Terashima .................... 257/487
2009/0050899 A1 * 2/2009 Ikeda et al. ..................... 257/77
2009/0068815 A1 * 3/2009 Tokuda et al. ................ 438/424
2009/0078936 A1 * 3/2009 Fujii .............................. 257/51
2009/0224353 A1 * 9/2009 Yamamoto et al. ........... 257/471
2009/0283798 A1 * 11/2009 Tsuzuki et al. ............... 257/140
2010/0078673 A1 * 4/2010 Morand ........................ 257/109

FOREIGN PATENT DOCUMENTS

JP 11-274516 10/1999

* cited by examiner

SEMICONDUCTOR DEVICE

CROSS-REFERENCE TO RELATED APPLICATIONS

This application is based upon and claims the benefit of priority from the prior Japanese Patent Application No. 2008-269069, filed on Oct. 17, 2008; the entire contents of which are incorporated herein by reference.

BACKGROUND OF THE INVENTION

1. Field of the Invention

This invention relates to a semiconductor device.

2. Background Art

In a semiconductor device, such as a diode and IGBT (insulated gate bipolar transistor), semiconductor layers in contact with the anode electrode and the cathode electrode are highly doped with impurities to achieve good contact characteristics. When such a semiconductor device is switched on/off, migration of carriers injected and accumulated in the semiconductor layer causes voltage waveform oscillation in the semiconductor layer and switching loss.

In this regard, there is a technique for reducing carrier injection efficiency by, for instance, selectively forming trenches from the surface of the p-type emitter layer to a halfway depth and providing a main electrode so as to cover the inside of the trenches and the surface of the p-type emitter layer (see, e.g., JP-A 11-274516 (Kokai) (1999)). However, in this structure, the distance between the main electrode and the $n^-$-base layer below the p-type emitter layer is short in the trench portion, and impurity concentration is low in the portion of the p-type emitter layer sandwiched between the $n^-$-base layer and the main electrode. Hence, the leakage current tends to increase, leaving room for improvement.

SUMMARY OF THE INVENTION

According to an aspect of the invention, there is provided a semiconductor device including: a first semiconductor layer; a first electrode provided on a first surface side of the first semiconductor layer; a first insulating layer provided between the first semiconductor layer and the first electrode and configured to constrict current flowing between the first semiconductor layer and the first electrode; and a second semiconductor layer of a first conductivity type provided at least on a path of the current constricted by the first insulating layer and being contact with the first electrode, the second semiconductor layer containing first impurities at a concentration higher than a concentration of impurities contained in the first semiconductor layer.

DETAILED DESCRIPTION OF THE INVENTION

Figure 1A:
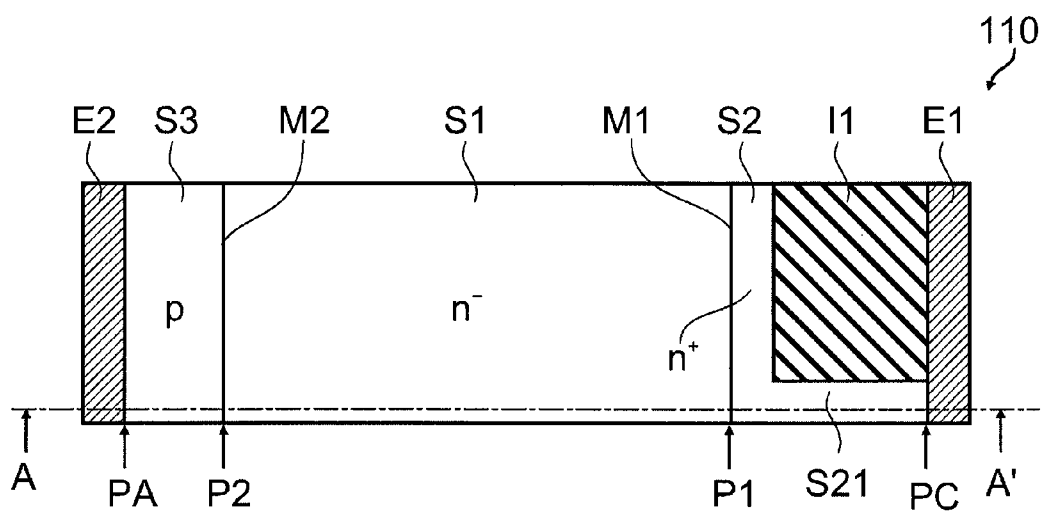
FIGS. 1A and 1B are schematic views illustrating the configuration of a semiconductor device according to a first embodiment of the invention.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same elements as those described previously with reference to earlier figures are labeled with like reference numerals, and the detailed description thereof is omitted as appropriate.

First Embodiment

Figure 1B:
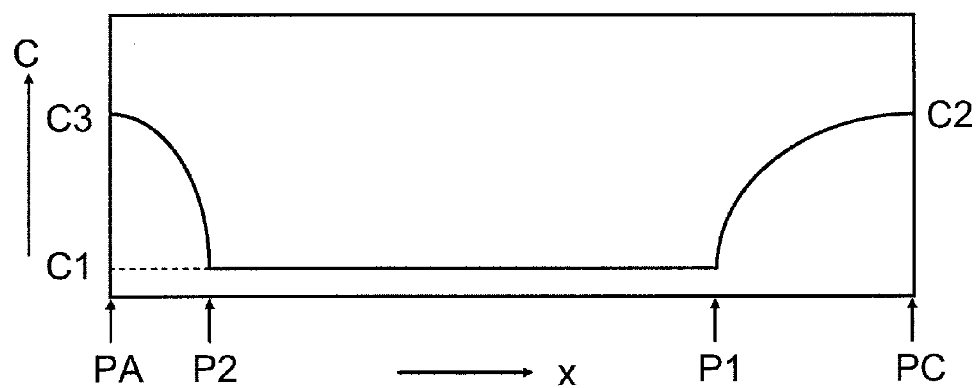

FIGS. 1A and 1B are schematic views illustrating the configuration of a semiconductor device according to a first embodiment of the invention.

More specifically, FIG. 1A is a schematic cross-sectional view, and FIG. 1B is a graph illustrating the impurity concentration profile in the A-A' cross section of FIG. 1A. In FIG.

1B, the horizontal axis represents position x in the stacking direction of the semiconductor device, and the vertical axis represents impurity concentration C.

As shown in FIG. 1A, the semiconductor device 110 according to the first embodiment of the invention includes a base layer S1 (first semiconductor layer), a cathode layer S2 (second semiconductor layer), a first insulating layer I1, and a cathode electrode E1 (first electrode).

The cathode electrode E1 is provided on the first surface M1 side of the base layer S1.

The first insulating layer I1 is provided between the base layer S1 and the cathode electrode E1 to constrict the current flowing between the base layer S1 and the cathode electrode E1.

The cathode layer S2 is provided at least on the current path constricted by the first insulating layer I1, contains impurities at a concentration higher than the concentration of impurities contained in the base layer S1, and has a first conductivity type.

More specifically, the cathode layer S2 is provided on the first surface M1 side of the base layer S1, includes a portion S21 whose cross section taken along a plane parallel to the first surface M1 is smaller than the cross section of the base layer S1, and contains impurities at a concentration higher than the concentration of impurities contained in the base layer S1. In the cathode layer S2, the aforementioned portion S21 having a smaller cross section than the base layer S1 is the current path constricted by the first insulating layer I1.

In this example, the cathode layer S2 has n-type conductivity.

Here, it is assumed that n-type conductivity is of the first conductivity type and p-type conductivity is of the second conductivity type. However, in the embodiments of the invention, the first conductivity type and the second conductivity type are interchangeable. In the following description, it is assumed that the first conductivity type is n-type and the second conductivity type is p-type. That is, the cathode layer S2 is an $n^+$-layer.

The base layer S1 can be of n-type or p-type irrespective of the conductivity type of the cathode layer S2. In the following description, it is assumed that the base layer S1 has n-type conductivity, that is, the base layer S1 is an $n^-$-layer.

In this example, the first insulating layer I1 is embedded in the portion of the cathode layer S2 except the portion S21 having a smaller cross section than the base layer S1.

However, as described later, the first insulating layer I1 is provided in at least one of the state of including a portion embedded in the portion of the cathode layer S2 except the portion S21 having a smaller cross section than the base layer S1, and the state of being provided on the opposite side of the cathode layer S2 from the base layer S1 and exposing at least part of the cathode layer S2.

In this example, the first insulating layer I1 is embedded in the portion of the cathode layer S2 except the portion S21. The first insulating layer I1 can be illustratively made of an insulative inorganic material, such as silicon oxide and silicon nitride, or organic material.

The cathode electrode E1 is provided on the opposite side of the cathode layer S2 from the base layer S1 and electrically connected to at least part of the cathode layer S2. The cathode electrode E1 can be made of any conductive material, such as aluminum and various other metals, and polysilicon highly doped with impurities.

In this example, the semiconductor device 110 further includes an anode layer S3 (third semiconductor layer) and an anode electrode E2 (second electrode).

The anode layer S3 is provided on the second surface M2 side of the base layer S1 opposite to the first surface M1, and contains impurities at a concentration higher than the concentration of impurities contained in the base layer S1. The anode layer S3 has the second conductivity type. That is, in this example, the anode layer S3 is a p-layer.

The anode electrode E2 is provided on the opposite side of the anode layer S3 from the base layer S1 and electrically connected to the anode layer S3. The anode electrode E2 can be made of any conductive material, such as aluminum and various other metals, and polysilicon highly doped with impurities.

Thus, the semiconductor device 110 according to this embodiment is a PN-type (PIN-type) diode and can be used as a rectifying element in a power circuit, such as an inverter. Furthermore, as described later, it is also applicable, for instance, to part of an insulated gate bipolar transistor (IGBT), and also applicable, for instance, to a free-wheeling diode, and a reverse conducting IGBT in which an IGBT is integrated with an anti-parallel free-wheeling diode.

An example method for manufacturing the semiconductor device 110 is as follows. For instance, n-type impurities, such as phosphorus (P) and arsenic (As), are introduced by diffusion, injection or other process into the backside, for instance, of an $n^-$-silicon substrate serving as a base layer S1, or a layer containing the aforementioned impurities is deposited on the backside of the $n^-$-silicon substrate by epitaxial growth or other technique, to form an $n^+$-layer serving as a cathode layer S2. Next, part of the layer is removed by etching or other method. Next, $SiO_2$, for instance, serving as a first insulating layer I1 is embedded in the removed portion, and chemical mechanical polishing (CMP) is performed as needed. Then, a conductive layer of aluminum or the like serving as a cathode electrode E1 is formed on the cathode layer S2 and the first insulating layer I1.

On the other hand, p-type impurities, such as boron (B), are introduced by diffusion, injection or other process into the frontside of the $n^-$-silicon substrate, or a layer containing the aforementioned impurities is deposited on the frontside of the silicon substrate by epitaxial growth or other technique, to form a layer serving as an anode layer S3. Then, a conductive layer of aluminum or the like serving as an anode electrode E2 is formed on the anode layer S3.

In the foregoing, the $n^+$-layer serving as a cathode layer S2 is first formed, and then partly removed, and a first insulating layer I1 is formed in the removed portion. However, as described later, the structure of the cathode layer S2 and the first insulating layer I1 can be variously modified, and the method for forming the cathode layer S2 and the first insulating layer I1 depends on the structure. Thus, the order of forming the cathode layer S2 and the first insulating layer I1 is arbitrary.

Furthermore, the method for forming the base layer S1, the cathode layer S2, the first insulating layer I1, the cathode electrode E1, the anode layer S3, and the anode electrode E2 is arbitrary. The order of forming them can be modified as long as technically feasible, including simultaneous formation.

The thickness (length in the direction perpendicular to the first surface M1) of the base layer S1 is illustratively 100-500 μm. The thickness of the cathode layer S2 is illustratively 5-100 μm. The thickness of the anode layer S3 is illustratively 2-50 μm. However, the foregoing is illustrative only. The invention is not limited thereto, but the thickness of the base layer S1, the cathode layer S2, and the anode layer S3 is arbitrary.

As shown in FIG. 1B, the impurity concentration in the cathode layer S2 is higher than the impurity concentration C1 in the base layer S1. Furthermore, the impurity concentration in the anode layer S3 is higher than the impurity concentration C1 in the base layer S1.

In FIG. 1B, position x corresponding to the first surface M1 is position P1, and position x corresponding to the second surface M2 is position P2. Position x where the cathode layer S2 is in contact with the cathode electrode E1 is position PC, and position x where the anode layer S3 is in contact with the anode electrode E2 is position PA.

The impurity concentration C1 at position P1-P2 corresponds to the impurity concentration in the base layer S1. The impurity concentration C1 in the base layer S1 can be illustratively $1\times10^{12}$-$1\times10^{15}$ $cm^{-3}$.

On the other hand, the impurity concentration in the cathode layer S2 is higher at position PC than at position P1 located on the base layer S1 side. That is, the concentration of impurities contained in the cathode layer S2 is higher on the cathode electrode E1 side than on the base layer S1 side. The maximum impurity concentration C2 in the cathode layer S2 is illustratively set in the range of $1\times10^{17}$-$1\times10^{19}$ $cm^{-3}$. Here, to improve contact characteristics between the cathode layer S2 and the cathode electrode E1, the impurity concentration C2 is more preferably set in the range of $1\times10^{18}$-$1\times10^{19}$ $cm^{-3}$.

On the other hand, the impurity concentration in the anode layer S3 is higher at position PA than at position P2 located on the base layer S1 side. That is, the concentration of impurities contained in the anode layer S3 is higher on the anode electrode E2 side than on the base layer S1 side. The maximum impurity concentration C3 in the anode layer S3 is illustratively set in the range of $1\times10^{17}$-$1\times10^{19}$ $cm^{-3}$. Here, to improve contact characteristics between the anode layer S3 and the anode electrode E2, the impurity concentration C3 is more preferably set in the range of $1\times10^{18}$-$1\times10^{19}$ $cm^{-3}$.

As described above, the semiconductor device 110 according to this embodiment has a structure in which part of the cathode layer S2 is removed. Thus, the cathode layer S2 has a smaller cross-sectional area than the base layer S1. Hence, even if the impurity concentration in the cathode layer S2 is sufficiently increased to achieve good contact, carriers injected and accumulated during high current operation are decreased, and hence the switching loss can be reduced. That is, the semiconductor device 110 has a structure in which the current flowing in the cathode layer S2 is constricted. This decreases the amount of injected carriers, and can reduce switching loss. Furthermore, as described later, the waveform oscillation during low current operation is suppressed.

Furthermore, the first insulating layer I1 is provided in the portion where the cathode layer S2 is removed. Thus, in the portion where the cathode layer S2 is removed, the distance between the cathode electrode E1 and the base layer S1 is a certain value or more, and they can be electrically insulated from each other except in the cathode layer S2 portion. Hence, there is no increase in leakage current.

Thus, the semiconductor device 110 according to this embodiment can serve as a semiconductor device with suppressed waveform oscillation and reduced switching loss without adversely affecting other characteristics, such as leakage current.

COMPARATIVE EXAMPLES

Figure 2A:
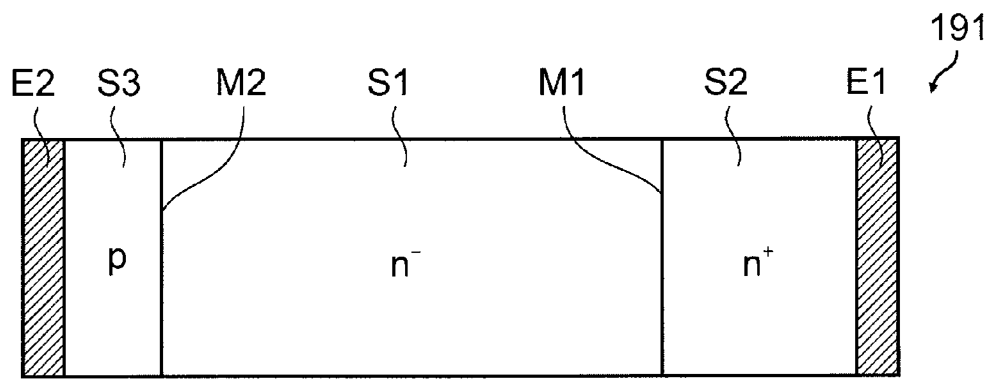
FIGS. 2A to 2C are schematic cross-sectional views illustrating the configuration of semiconductor devices of comparative examples.
Figure 2B:
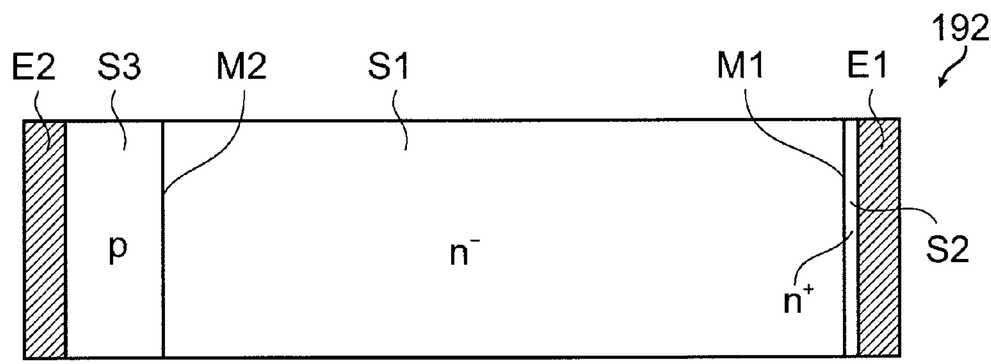
Figure 2C:
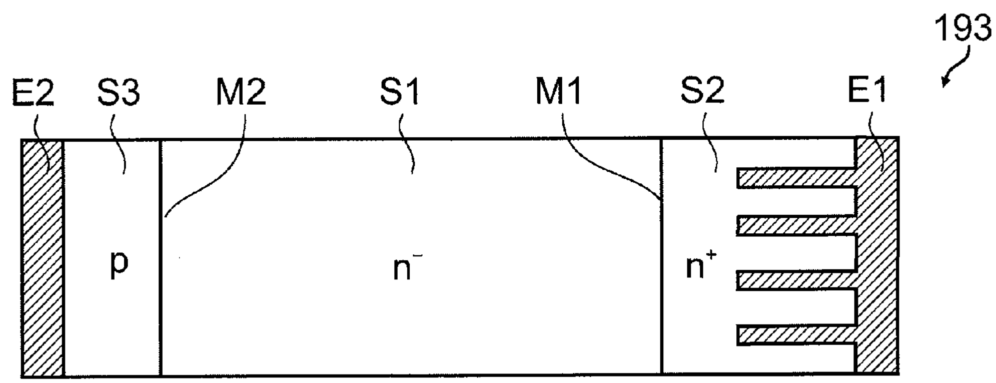

FIGS. 2A to 2C are schematic cross-sectional views illustrating the configuration of semiconductor devices of comparative examples.

More specifically, FIGS. 2A, 2B, and 2C illustrate the structure of semiconductor devices 191, 192, and 193 of a first, second, and third comparative examples, respectively.

As shown in FIG. 2A, in the semiconductor device 191 of the first comparative example, the cross section of the cathode layer S2 is the same in size as that of the base layer S1, and the first insulating layer I1 is not provided. The rest of the configuration is the same as that of the semiconductor device 110 according to this embodiment. In the semiconductor device 191 of the first comparative example thus configured, the cathode layer S2 is a thick $n^+$-layer with high impurity concentration. Hence, the carrier injection is high during high current operation, which increases switching loss.

Here, to prevent this, if the impurity concentration of the cathode layer S2 is decreased, the carrier injection is low during low current operation, which increases waveform oscillation. Further decreasing the impurity concentration degrades contact characteristics between the cathode layer S2 and the cathode electrode E1, which increases the resistance of the contact portion.

As shown in FIG. 2B, in the semiconductor device 192 of the second comparative example, the cathode layer S2 is thinner than that of the semiconductor device 191. Also in this case, the cross section of the cathode layer S2 is the same in size as that of the base layer S1, and the first insulating layer I1 is not provided. In the semiconductor device 192 of the second comparative example thus configured, the cathode layer S2 is made of a thin $n^+$-layer with high impurity concentration. Hence, the total amount of impurities is smaller than that of the semiconductor device 191. Hence, during high current operation, the carrier injection is low, and the amount of accumulated carriers is small, which decreases switching loss. However, to decrease switching loss to a practical range, the thickness of the cathode layer S2 needs to be thinned to e.g. 1 μm or less, which causes difficulty in fabrication. Furthermore, the cathode layer S2 is damaged by, for instance, spike-like protrusions of the cathode electrode E1 and flaws caused during the manufacturing process, which may increase leakage current.

As shown in FIG. 2C, in the semiconductor device 193 of the third comparative example, trenches are formed in the cathode layer S2, and a conductive layer serving as a cathode electrode E1 is provided inside the trenches and on the surface of the cathode layer S2. This structure is similar to the structure described in JP-A 11-274516 (Kokai). In the semiconductor device 193 of the third comparative example thus configured, the cathode layer S2 has a smaller cross section than the base layer S1. Hence, even during high current operation, the carrier injection is decreased, and the switching loss can be reduced. However, in the trench portion, the distance between the base layer S1 and the cathode electrode E1 is short. Here, even if this distance is short, the leakage current does not increase as long as the impurity concentration of the cathode layer S2 in the portion sandwiched between the trench and the base layer S1 is sufficiently high. However, typically, the impurity concentration of the cathode layer S2 sandwiched between the trench and the base layer S1 is low. Hence, the leakage current tends to increase, leaving room for improvement.

In contrast, as described above, in the semiconductor device 110 according to this embodiment, the cathode layer S2 includes a portion S21 having a smaller cross section than the base layer S1. Thus, carriers injected and accumulated during high current operation are decreased, and the switching loss can be reduced. Furthermore, the waveform oscillation is suppressed during low current operation. Furthermore, the first insulating layer I1 is provided in the portion where the cathode layer S2 is removed. Thus, the distance between the cathode electrode E1 and the base layer S1 is a certain value or more, and they can be electrically insulated from each other except in the cathode layer S2 portion. Hence, a low leakage current can be maintained.

Figure 3A:
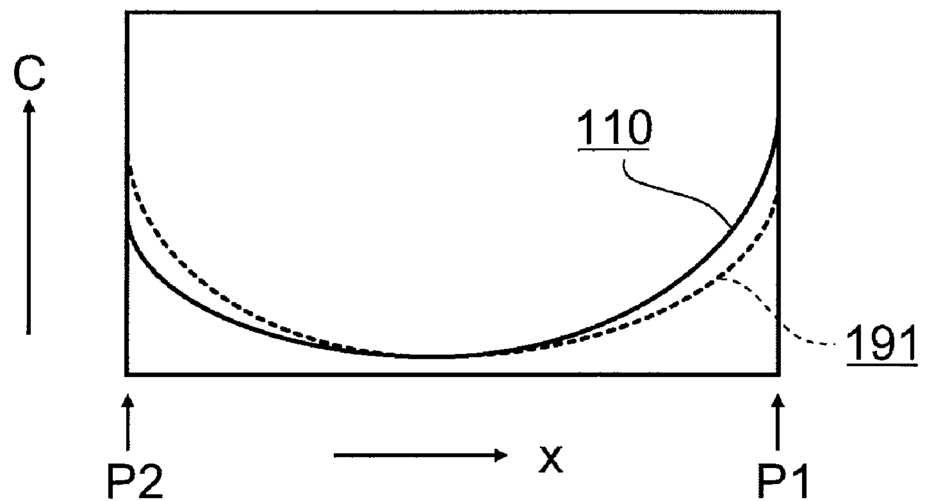
FIGS. 3A and 3B are schematic graphs illustrating carrier density in the semiconductor device according to the first embodiment of the invention and the semiconductor device of the first comparative example.
Figure 3B:
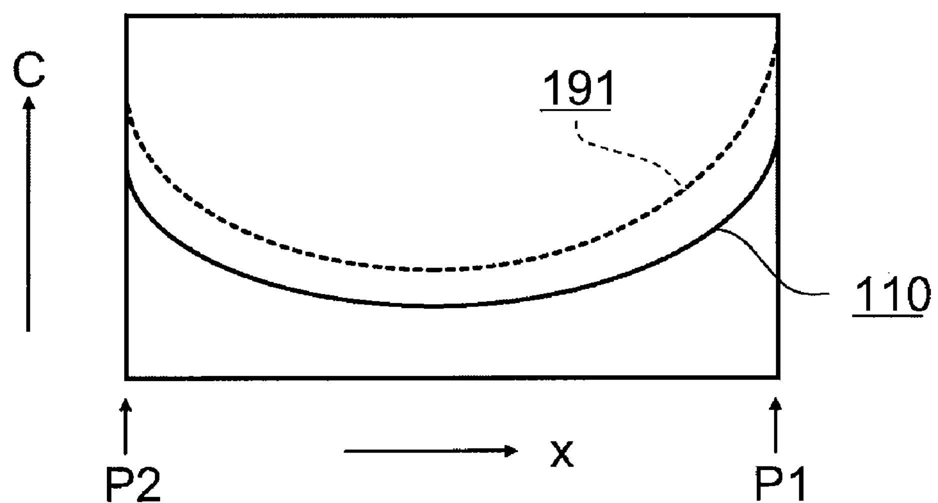

FIGS. 3A and 3B are schematic graphs illustrating carrier density in the semiconductor device according to the first embodiment of the invention and the semiconductor device of the first comparative example.

More specifically, FIG. 3A illustrates carrier density during low current operation, and FIG. 3B illustrates carrier density during high current operation. In these figures, the horizontal axis represents position x in the direction parallel to the thickness in the base layer S1, where position P1 and position P2 correspond to the first surface M1 and the second surface M2, respectively. The vertical axis represents carrier density C. The solid line corresponds to the semiconductor device 110 according to this embodiment, and the dashed line corresponds to the semiconductor device 191 of the first comparative example.

As shown in FIG. 3A, during low current operation, in the semiconductor device 110 according to this embodiment, the carrier density C on the cathode layer S2 side (the side near position P1) is higher than in the semiconductor device 191 of the first comparative example. That is, in the semiconductor device 110, carriers can be sufficiently injected from the portion of the cathode layer S2 having relatively low impurity concentration.

On the other hand, as shown in FIG. 3B, during high current operation, in the semiconductor device 110 according to this embodiment, the carrier density C is lower at any position x than in the semiconductor device 191 of the first comparative example, and hence the carrier density C is entirely low. Thus, in the semiconductor device 110, the injected carrier density C is low, and the amount of accumulated carriers is small, which decreases switching loss.

Figure 4A:
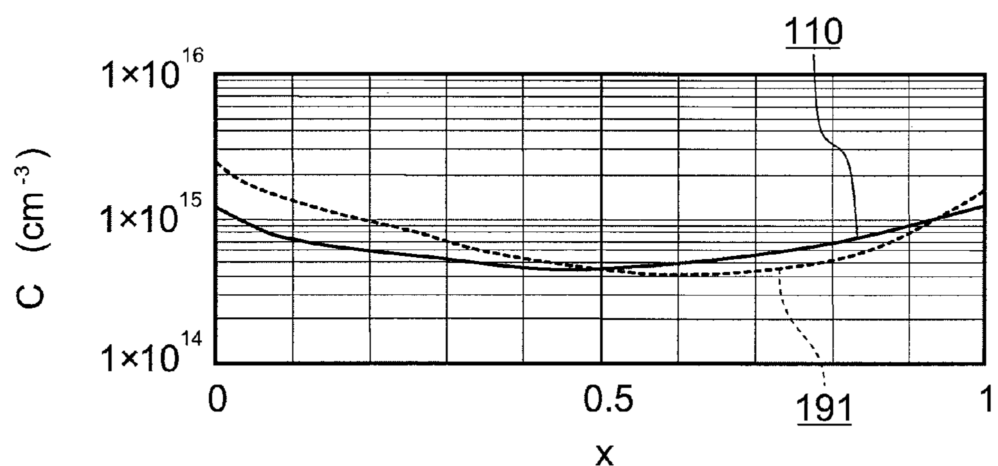
FIGS. 4A and 4B are graphs illustrating the characteristics of the semiconductor device according to the first embodiment of the invention and the semiconductor device of the first comparative example
Figure 4B:
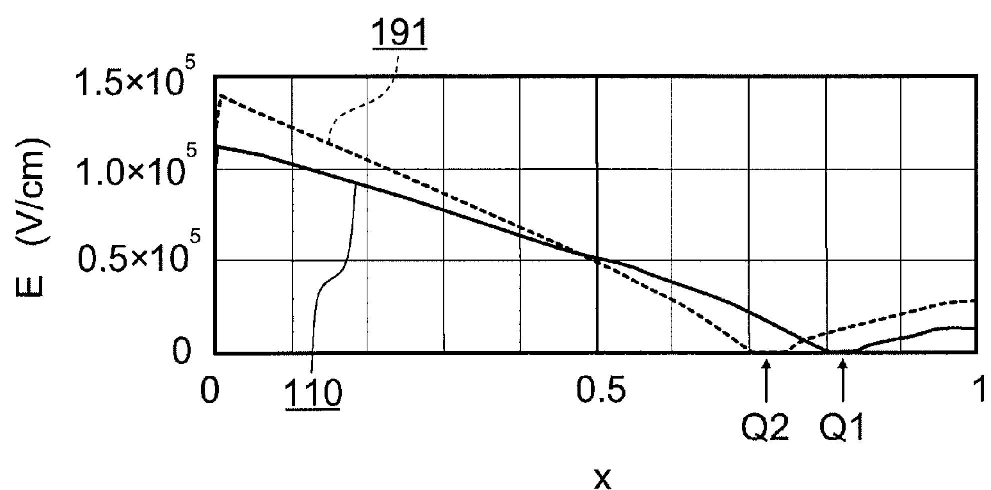

FIGS. 4A and 4B are graphs illustrating the characteristics of the semiconductor device according to the first embodiment of the invention and the semiconductor device of the first comparative example.

More specifically, FIG. 4A illustrates the result of simulating the distribution of carrier density during low current operation. The horizontal axis represents position x in the direction parallel to the thickness in the base layer S1, represented in relative values with the thickness of the base layer S1 defined as 1. That is, position x equal to 0 corresponds to the second surface M2, and position x equal to 1 corresponds to the first surface M1. The vertical axis represents carrier density C. On the other hand, FIG. 4B illustrates the result of simulating the electric field distribution in the base layer S1 during low current operation. The horizontal axis represents position x in the direction parallel to the thickness in the base layer S1. The vertical axis represents electric field E in the base layer S1. In these figures, the solid line corresponds to the semiconductor device 110 according to this embodiment, and the dashed line corresponds to the semiconductor device 191 of the first comparative example. In the foregoing, characteristics simulation is performed in the case where the low current is 2.5 A. The impurity concentration in the semiconductor device 110 and the semiconductor device 191 is adjusted so that an equal current flows therein.

As shown in FIG. 4A, in the semiconductor device 110 according to this embodiment, the carrier density C in the region near the cathode layer S2, that is, in the region where position x is 0.5-0.9, is higher than in the semiconductor device 191 of the first comparative example. That is, carriers can be sufficiently injected from the cathode layer S2 to achieve appropriate operation.

In the region near the anode layer S3, that is, in the region where position x is 0-0.5, the carrier density C of the semiconductor device 110 is lower than that of the semiconductor device 191. However, the characteristic in the region near the cathode layer S2 is important to the operation of the semiconductor device. Hence, the characteristic of the semiconductor device 110 according to this embodiment is desirable.

On the other hand, as shown in FIG. 4B, in the semiconductor device 110 and the semiconductor device 191, the electric field E in the base layer S1 decreases as position x increases from 0. After the electric field E once vanishes, the electric field E increases as position x further increases.

The characteristic of electric field E decreasing with the increase of position x from 0 corresponds to the extension of the depletion layer from the anode layer S3 into the base layer S1. That is, the region of position x where the electric field E is sloped with respect to position x indicates that the depletion layer is formed. On the other hand, the characteristic of electric field E decreasing with the decrease of position x from 1 corresponds to the extension of the depletion layer from the cathode layer S2 into the base layer S1. It is noted that depending on the characteristics of the semiconductor device, the depletion layer may extend only from the anode layer S3 into the base layer S1, and not from the cathode layer S2. However, in the following description, it is assumed that the depletion layers extend into the base layer S1 from both the anode layer S3 and the cathode layer S2.

In the portion where the electric field E has no slope with respect to position x, the depletion layers extending from the anode layer S3 and the cathode layer S2 meet with each other. That is, this position is where a punch-through phenomenon occurs. Here, the characteristic illustrated in FIG. 4B is the characteristic of electric field E in the base layer S1 at a certain time, illustrating the characteristic immediately before the punch-through phenomenon occurs. Hence, the position x where the electric field E has no slope spreads over a certain range. At a time subsequent to that time, the depletion layers meet with each other at one point of position x, and a punch-through phenomenon occurs. The position x where the electric field E has no slope is hereinafter referred to as "punch-through position".

As shown in FIG. 4B, in the semiconductor device 110 according to this embodiment, the punch-through position Q1 is approximately 0.83. In the semiconductor device 191 of the first comparative example, the punch-through position Q2 is approximately 0.72. Thus, the punch-through position Q1 in the semiconductor device 110 is larger than the punch-through position Q2 in the semiconductor device 191. That is, the punch-through position is closer to the cathode layer S2 side in the semiconductor device 110 than in the semiconductor device 191. Thus, in the semiconductor device 110, the waveform oscillation is suppressed.

In the following, the waveform oscillation is described.

Here, for simplicity, the description is given of the structure of the semiconductor device 191 of the first comparative example, that is, the simple structure in which the cross section of the cathode layer S2 is the same in size as that of the base layer S1 and the first insulating layer I1 is not provided. In such a structure, the surge voltage $V_{surge}$ in the waveform oscillation is given by the following formula:

$$V_{surge} \propto \frac{W_P}{\varepsilon} \cdot \left( \frac{2 \cdot \varepsilon \cdot V - q \cdot N \cdot W \cdot (2 \cdot W_P - W)}{W_P^2 + (W - W_P)^2} + q \cdot N \right) - \frac{q \cdot N \cdot W}{\varepsilon}$$

where $V_{surge}$ is the potential difference between the maximum voltage of the waveform oscillation and the supply voltage. Furthermore, Wp is the punch-through position, $\epsilon$ is the dielectric constant of the semiconductor layer (silicon), q is the elementary charge, N is the carrier concentration of the base layer S1, W is the thickness of the base layer S1, and V is the voltage at which a punch-through phenomenon occurs.

Figure 5:
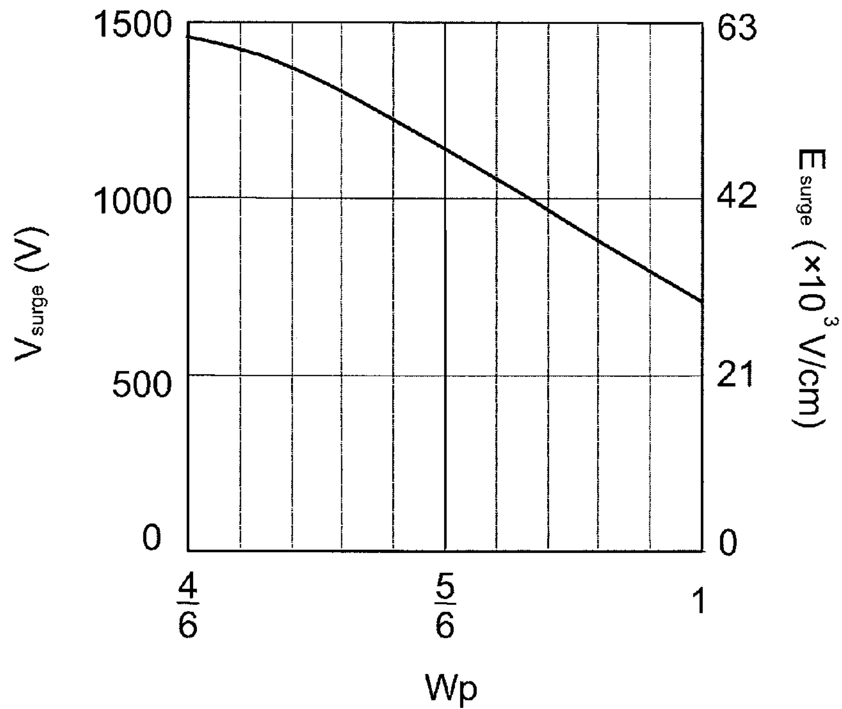
FIG. 5 is a graph illustrating the characteristic of the waveform oscillation of the semiconductor device.

FIG. 5 is a graph illustrating the characteristic of the waveform oscillation of the semiconductor device.

More specifically, this figure illustrates the result of calculating the relationship between punch-through position Wp and surge voltage $V_{surge}$ in the waveform oscillation based on the above formula. The horizontal axis represents punch-through position Wp in relative values with the thickness of the base layer S1 defined as 1. The vertical axis represents surge voltage $V_{surge}$. In this calculation, the voltage V at which a punch-through phenomenon occurs is set to 1700 V. The vertical axis of this figure also shows electric field $E_{surge}$ corresponding to the surge voltage $V_{surge}$.

As shown in FIG. 5, the surge voltage $V_{surge}$ decreases as the punch-through position Wp increases. This indicates that increasing the punch-through position Wp is effective in decreasing the surge voltage $V_{surge}$ to suppress waveform oscillation.

As described above with reference to FIG. 4B, the punch-through position Q1 in the semiconductor device 110 is larger than the punch-through position Q2 in the semiconductor device 191. Hence, in the semiconductor device 110, the surge voltage $V_{surge}$ is smaller than in the semiconductor device 191, that is, the waveform oscillation is suppressed.

Figure 6A:
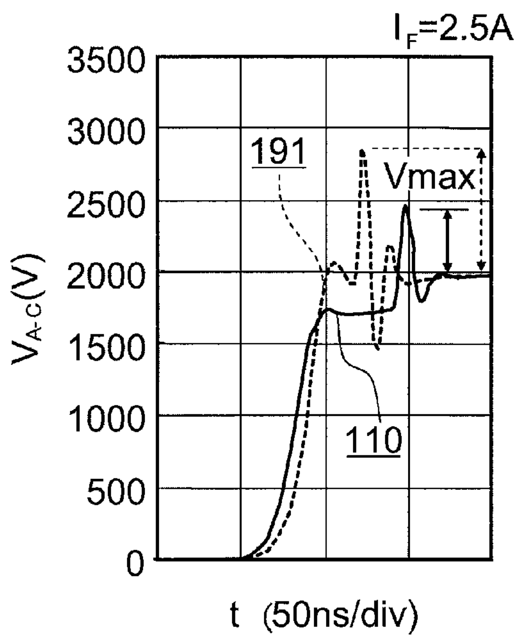
FIGS. 6A and 6B are graphs illustrating the characteristics of the semiconductor device according to the first embodiment of the invention and the semiconductor device of the first comparative example.
Figure 6B:
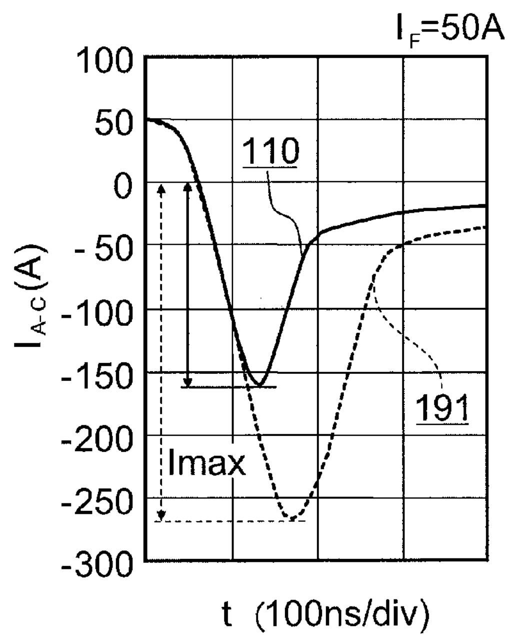

FIGS. 6A and 6B are graphs illustrating the characteristics of the semiconductor device according to the first embodiment of the invention and the semiconductor device of the first comparative example.

More specifically, these figures illustrate the result of simulating the characteristic of switching from the ON state to the OFF state, that is, reverse recovery characteristic, in the semiconductor device 110 according to this embodiment and the semiconductor device 191 of the first comparative example. FIG. 6A shows the characteristic during low current operation, and FIG. 6B shows the characteristic during high current operation. Here, because waveform oscillation matters during low current operation, FIG. 6A shows the temporal variation of voltage representing waveform oscillation, which is the characteristic where the low current is a forward current $I_F$ of 2.5 A. On the other hand, because switching loss matters during high current operation, FIG. 6B shows the temporal variation of current related to the switching characteristic, which is the characteristic where the high current is a forward current $I_F$ of 50 A.

In these figures, the horizontal axis represents time t, the vertical axis of FIG. 6A is the voltage $V_{A-C}$ between the anode electrode E2 and the cathode electrode E1, and the vertical axis of FIG. 6B is the current $I_{A-C}$ flowing between the anode electrode E2 and the cathode electrode E1. The solid line corresponds to the semiconductor device 110 according to this embodiment, and the dashed line corresponds to the semiconductor device 191 of the first comparative example.

As shown in FIG. 6A, during low current operation, in the semiconductor device 191 of the first comparative example, the voltage $V_{A-C}$ oscillates significantly. In contrast, in the semiconductor device 110 according to this embodiment, the oscillation of the voltage $V_{A-C}$ is suppressed. Here, the difference between the maximum of the waveform oscillation and the supply voltage (in this example, 2000 V) is defined as the maximum surge voltage Vmax. Then, the maximum surge voltage Vmax of the semiconductor device 110 is approximately half that of the semiconductor device 191. Here, the maximum surge voltage Vmax corresponds to the surge voltage $V_{surge}$.

On the other hand, as shown in FIG. 6B, during high current operation, in the semiconductor device 191 of the first comparative example, the current $I_{A-C}$ acquires a large absolute value with negative polarity, and then the absolute value gradually decreases toward 0. In contrast, in the semiconductor device 110 according to this embodiment, although the current $I_{A-C}$ swings to negative polarity, its absolute value is smaller than in the semiconductor device 191. Here, the maximum absolute value of the current $I_{A-C}$ on the negative side is the maximum recovery current Imax of the reverse recovery characteristic. The maximum recovery current Imax in the semiconductor device 110 is decreased to approximately 60% of that in the semiconductor device 191.

The simulation results for the characteristics, including the above characteristics, of the semiconductor device 110 according to this embodiment and the semiconductor device 191 of the first comparative example are summarized in the following TABLE 1.

TABLE 1

| | $I_F$ (A) | 110 | 191 |
|---|---|---|---|
| Vmax | 2.5 | 0.53 | 1 |
| $V_F$ | 2.5 | 1 | 1 |
| | 50 | 1.91 | 1 |
| Imax | 50 | 0.59 | 1 |
| E | 2.5 | 1.06 | 1 |
| | 50 | 0.38 | 1 |

In this table, the characteristics of the semiconductor device 110 according to this embodiment are represented in relative values with the characteristics of the semiconductor device 191 of the first comparative example defined as 1.

As shown in this table, when the forward current $I_F$ is 2.5 A, the maximum surge voltage Vmax of the waveform oscillation in the semiconductor device 110 is 0.53 times that in the semiconductor device 191, indicating a significant decrease.

When the forward current $I_F$ is 50 A, the maximum recovery current Imax in the semiconductor device 110 is 0.59 times that in the semiconductor device 191, and the switching loss E is 0.38 times that in the semiconductor device 191, indicating significant decreases.

With regard to characteristics other than the foregoing, the forward voltage $V_F$ at a forward current $I_F$ of 2.5 A remains unchanged between the semiconductor device 110 and the semiconductor device 191. On the other hand, the forward voltage $V_F$ at a forward current $I_F$ of 50 A in the semiconductor device 110 is increased to 1.91 times that in the semiconductor device 191. However, it has no substantial problem in applications where the switching loss primarily accounts for the inverter loss. Furthermore, when the forward current $I_F$ is 2.5 A, the switching loss E of the semiconductor device 110 is nearly equal to that of the semiconductor device 191.

As described above, in the semiconductor device 110, because the first insulating layer I1 is provided, there is no concern about the increase of leakage current.

Thus, the semiconductor device 110 according to this embodiment can serve as a semiconductor device with suppressed waveform oscillation and reduced switching loss without adversely affecting other characteristics, such as leakage current.

In the following, several variations of this embodiment are described.

Figure 7A:
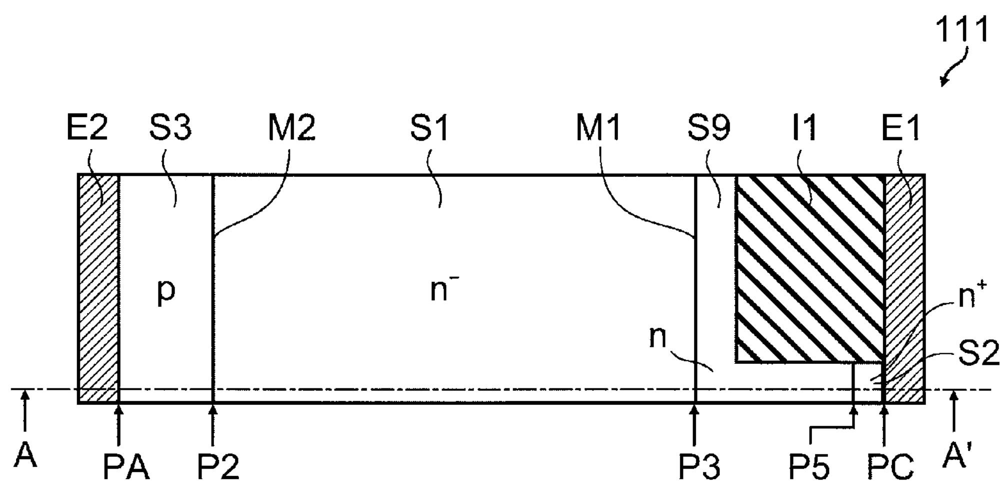
FIGS. 7A and 7B are schematic views illustrating the configuration of an alternative semiconductor device according to the first embodiment of the invention.
Figure 7B:
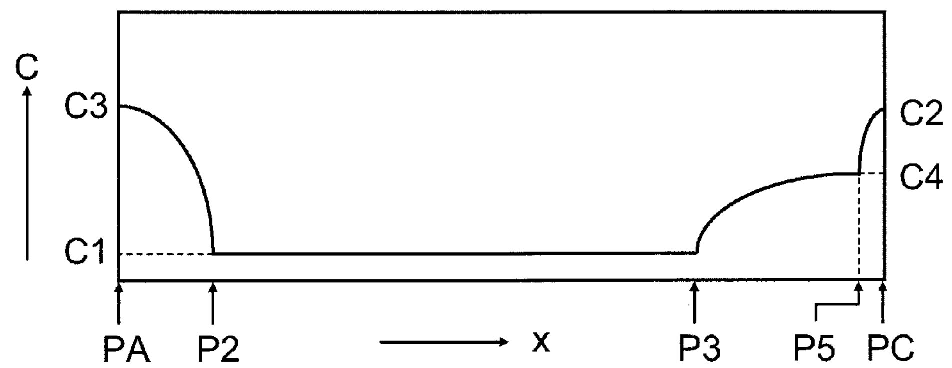

FIGS. 7A and 7B are schematic views illustrating the configuration of an alternative semiconductor device according to the first embodiment of the invention.

More specifically, FIG. 7A is a schematic cross-sectional view, and FIG. 7B is a graph illustrating the impurity concentration profile in the A-A' cross section of FIG. 7A. In FIG. 7B, the horizontal axis represents position x in the stacking direction of the semiconductor device, and the vertical axis represents impurity concentration C.

As shown in FIG. 7A, in the semiconductor device 111 according to this embodiment, the cathode layer S2 in its entirety has a smaller cross section than the base layer S1. Furthermore, an n-layer S9 having a higher impurity concentration than the base layer S1 and a lower impurity concentration than the cathode layer S2 is provided between the cathode layer S2 and the base layer S1. In this example, part of the n-layer S9 has a smaller cross section than the base layer S1.

More specifically, as shown in FIG. 7B, in the stacked structure of the n-layer S9 and the cathode layer S2, the impurity concentration is varied in two steps. Thus, varying the impurity concentration in a plurality of steps from the base layer S1 to the cathode layer S2 facilitates controlling the impurity concentration profile and allows the impurity concentration to be controlled more precisely. That is, manufacturing is facilitated.

The semiconductor device 111 thus configured can serve as a semiconductor device with suppressed waveform oscillation, reduced switching loss, and high manufacturability without adversely affecting other characteristics, such as leakage current.

In this example, an n-layer S9 is provided between the base layer S1 and the cathode layer S2 to vary the impurity concentration in two steps from the base layer S1 to the cathode layer S2. However, the number of semiconductor layers provided between the base layer S1 and the cathode layer S2 is arbitrary, and the n-layer S9 can be composed of a plurality of layers with different impurity concentrations. That is, the impurity concentration can be varied in three or more steps.

In the foregoing, the structure illustrated in FIG. 7A is described, for convenience, as a structure in which an n-layer S9 is provided between the base layer S1 and the cathode layer S2. However, instead of regarding the n-layer S9 as being additionally provided, it is also possible to regard the cathode layer S2 as having the shape illustrated in FIG. 1A and the impurity concentration in the cathode layer S2 as being varied in two steps in an n-layer and an $n^+$-layer. That is, the n-layer S9 illustrated in FIG. 7A can be regarded as part of the cathode layer.

In this example, the impurity concentration is varied in a plurality of steps on the cathode layer S2 side. However, the impurity concentration can be varied in a plurality of steps on the anode layer S3 side. More specifically, for instance, a p-type semiconductor layer having a higher impurity concentration than the base layer S1 and a lower impurity concentration than the anode layer S3 can be provided between the anode layer S3 and the base layer S1. Also in this case, it is easier to control the impurity concentration profile on the anode layer S3 side, allowing the impurity concentration to be controlled more precisely. That is, manufacturing is facilitated.

Figure 8A:
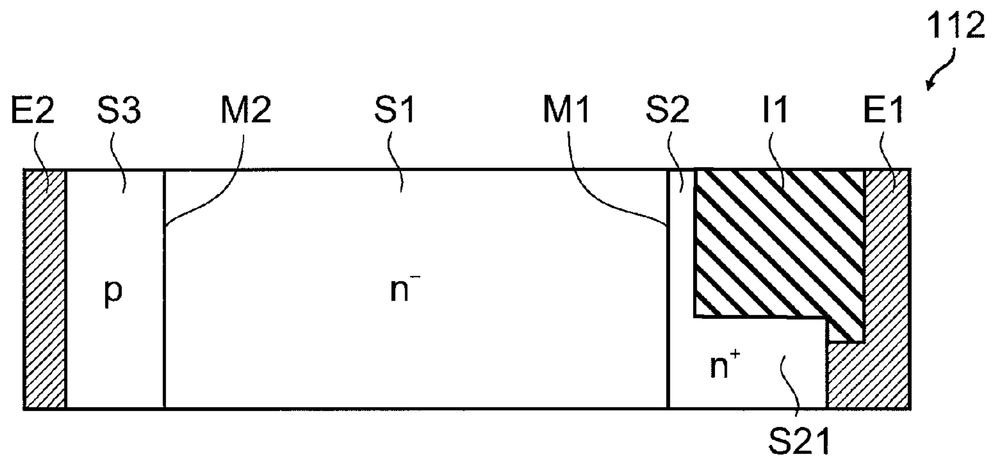
FIGS. 8A to 8C are schematic cross-sectional views illustrating the configuration of alternative semiconductor devices according to the first embodiment of the invention.
Figure 8B:
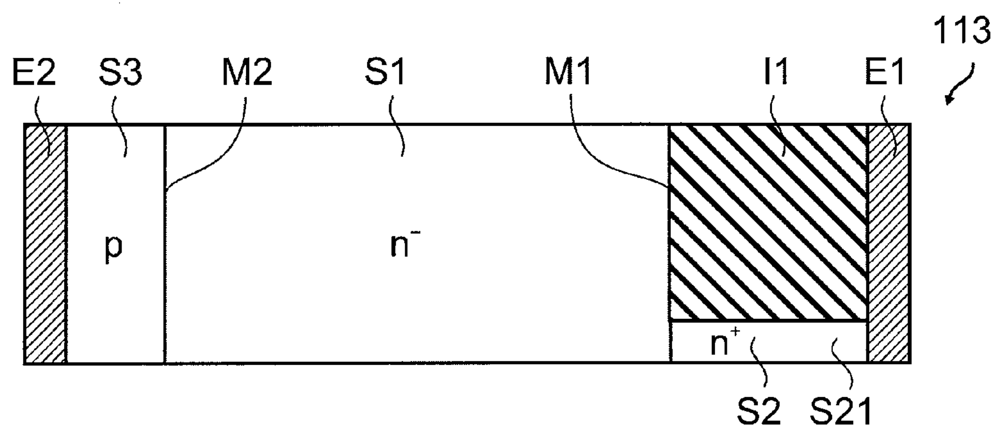
Figure 8C:
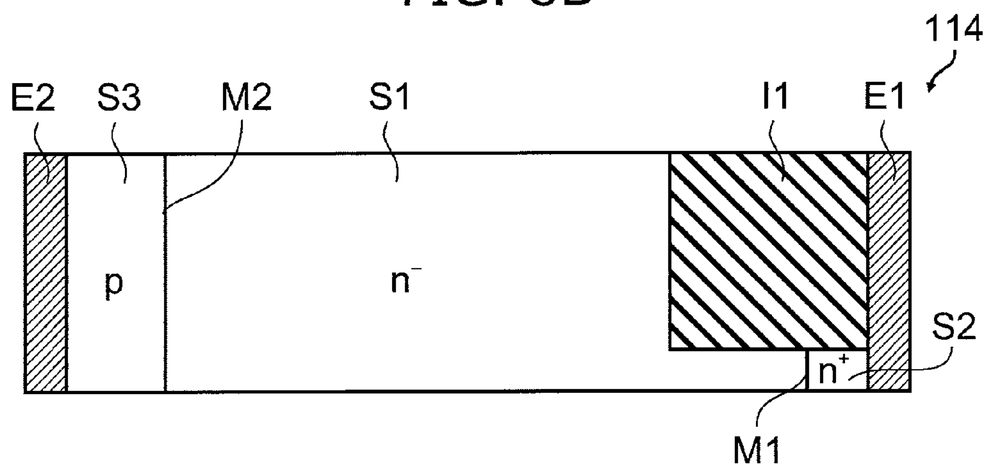

FIGS. 8A to 8C are schematic cross-sectional views illustrating the configuration of alternative semiconductor devices according to the first embodiment of the invention.

As shown in FIG. 8A, in an alternative semiconductor device 112 according to this embodiment, the first insulating layer I1 includes a portion embedded in the portion of the cathode layer S2 except the portion S21 having a smaller cross section than the base layer S1. Furthermore, the first insulating layer I1 is provided so as to expose part of the surface on the opposite side of the cathode layer 52 from the base layer S1 and cover the portion except the exposed portion. Thus, the shape of the first insulating layer I1 is arbitrary as long as it allows electrical connection between the cathode layer S2 and the cathode electrode E1 while including a portion embedded in the portion of the cathode layer S2 except the portion S21 having a smaller cross section than the base layer S1.

As shown in FIG. 8B, in an alternative semiconductor device 113 according to this embodiment, the cathode layer S2 in its entirety has a smaller cross section than the base layer S1. Furthermore, the first insulating layer I1 is embedded in the region where the cathode layer S2 is removed. That is, the first insulating layer I1 is provided between the base layer S1 and the cathode electrode E1.

As shown in FIG. 8C, in an alternative semiconductor device 114 according to this embodiment, the base layer S1 includes a portion having a smaller cross section than the rest on the cathode electrode E1 side of the base layer S1. The cathode layer S2 is provided between that portion and the cathode electrode E1. Also in this case, the cathode layer S2 has a smaller cross section than the base layer S1. Thus, the base layer S1 can partly include a portion having a smaller cross section.

The semiconductor devices 112, 113, and 114 thus configured can also serve as a semiconductor device with suppressed waveform oscillation and reduced switching loss without adversely affecting other characteristics, such as leakage current.

In the above semiconductor devices 110, 111, 112, 113, and 114, the first insulating layer I1 is provided between the base layer S1 and the cathode electrode E1 while being embedded in the portion of the cathode layer S2 except the portion S21. Thus, the base layer S1 and the cathode electrode E1 are not in direct contact with each other. That is, the cathode layer S2 having a smaller cross section than the base layer S1 serves as a current path between the base layer S1 and the cathode electrode E1.

Figure 9A:
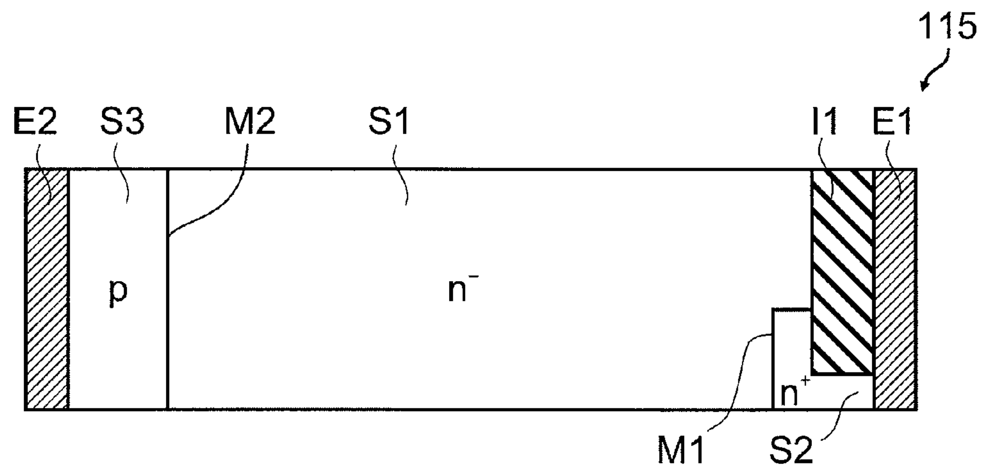
FIGS. 9A and 9B are schematic cross-sectional views illustrating the configuration of alternative semiconductor devices according to the first embodiment of the invention.
Figure 9B:
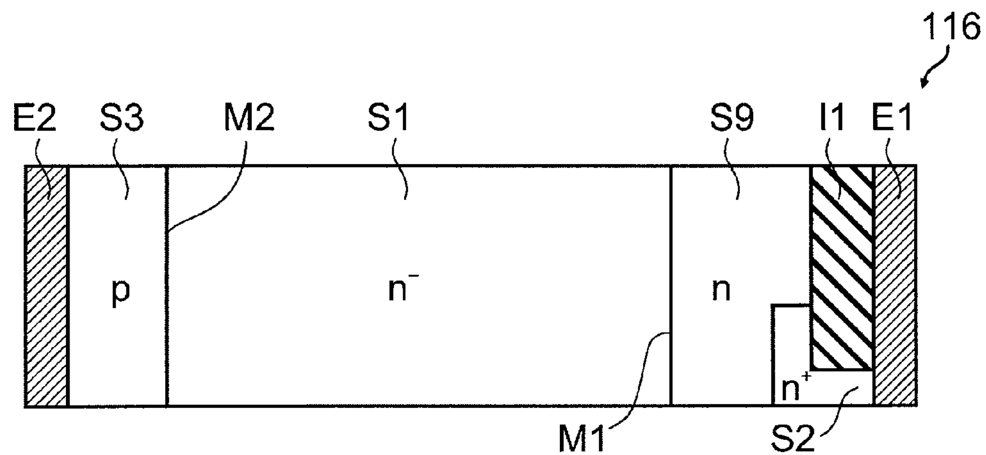

FIGS. 9A and 9B are schematic cross-sectional views illustrating the configuration of alternative semiconductor devices according to the first embodiment of the invention.

As shown in FIG. 9A, in an alternative semiconductor device 115 according to this embodiment, the cathode layer S2 has a smaller cross section than the base layer S1, and the cross-sectional area is varied in two steps. The first insulating layer I1 is embedded in the portion of the cathode layer S2 having the smallest cross-sectional area.

The semiconductor device 115 thus configured can also serve as a semiconductor device with suppressed waveform oscillation and reduced switching loss without adversely affecting other characteristics, such as leakage current.

The semiconductor device 115 can be manufactured illustratively as follows. For instance, first, a mask is formed on a portion of an $n^-$-silicon substrate serving as a base layer S1. In this state, n-type impurities, such as phosphorus (P) and arsenic (As), are introduced by diffusion, injection or other process into the portion of the $n^-$-silicon substrate to form a layer serving as a cathode layer S2. Next, after the mask is removed, the $n^-$-silicon substrate and the layer serving as a cathode layer S2 are removed to a halfway depth to form a base layer S1 and a cathode layer S2. Next, $SiO_2$, for instance, serving as a first insulating layer I1 is embedded in the removed portion, and CMP processing is performed as needed. Subsequently, a conductive layer of aluminum or the like serving as a cathode electrode E1 is formed on the cathode layer S2 and the first insulating layer I1. Furthermore, by the method described above, an anode layer S3 and an anode electrode E2 are formed.

Alternatively, the following manufacturing method can also be used. For instance, first, part of an $n^-$-silicon substrate serving as a base layer S1 is removed. Next, $SiO_2$, for instance, serving as a first insulating layer I1 is embedded in the removed portion, and CMP processing is performed as needed. Subsequently, the first insulating layer I1 is used as a mask to introduce n-type impurities, such as phosphorus (P) and arsenic (As), by diffusion, injection or other process into the portion of the $n^-$-silicon substrate to form a cathode layer S2. Here, the n-type impurities are diffused into the portion of the $n^-$-silicon substrate blocked by the first insulating layer I1 so that the cathode layer S2 is formed into a shape having a cross section with two steps. Subsequently, by the method described above, a cathode electrode E1, an anode layer S3, and an anode electrode E2 are formed. Thus, the semiconductor device 115 is fabricated.

In the foregoing, the shape of the cathode layer S2 can be controlled by the method for introducing n-type impurities and its condition. More specifically, the cathode layer S2 can be formed into a columnar shape with nearly one-step cross-sectional area, or a shape whose cross-sectional area is significantly varied in two steps.

As shown in FIG. 9B, in an alternative semiconductor device 116 according to this embodiment, the cathode layer S2 has a smaller cross section than the base layer S1, and the cross-sectional area is varied in two steps. The first insulating layer I1 is embedded in the portion of the cathode layer S2 having the smallest cross-sectional area. Furthermore, the cathode layer S2 and the first insulating layer I1 are separated from the base layer S1 by an n-layer S9 having a higher impurity concentration than the base layer S1 and a lower impurity concentration than the cathode layer S2.

The semiconductor device 116 thus configured can also serve as a semiconductor device with suppressed waveform oscillation and reduced switching loss without adversely affecting other characteristics, such as leakage current.

The semiconductor device 116 can be manufactured by partially modifying the manufacturing method described with reference to the semiconductor device 115. For instance, an n-layer S9 is provided on the first surface M1 side of an $n^-$-silicon substrate serving as a base layer S1, and a mask is formed on a portion of the n-layer S9. Then, n-type impurities, such as phosphorus (P) and arsenic (As), are introduced by diffusion, injection or other process into the portion of the n-layer S9 to form a layer serving as a cathode layer S2. Next, after the mask is removed, the n-layer S9 and the layer serving as a cathode layer S2 are removed to a halfway depth. Next, $SiO_2$, for instance, serving as a first insulating layer I1 is embedded in the removed portion, and CMP processing is performed as needed. Subsequently, by the method described above, a cathode electrode E1, an anode layer S3, and an anode electrode E2 are formed.

In an alternative method, an n-layer S9 is provided on the first surface M1 side of an $n^-$-silicon substrate serving as a base layer S1, and part of the n-layer S9 is removed. Next, $SiO_2$ serving as a first insulating layer I1 is embedded in the removed portion, and the first insulating layer I1 is used as a mask to introduce n-type impurities into the portion of the n-layer S9 to form a cathode layer S2. Next, by the method described above, a cathode electrode E1, an anode layer S3, and an anode electrode E2 are formed. Thus, the semiconductor device 116 can be fabricated.

Figure 10A:
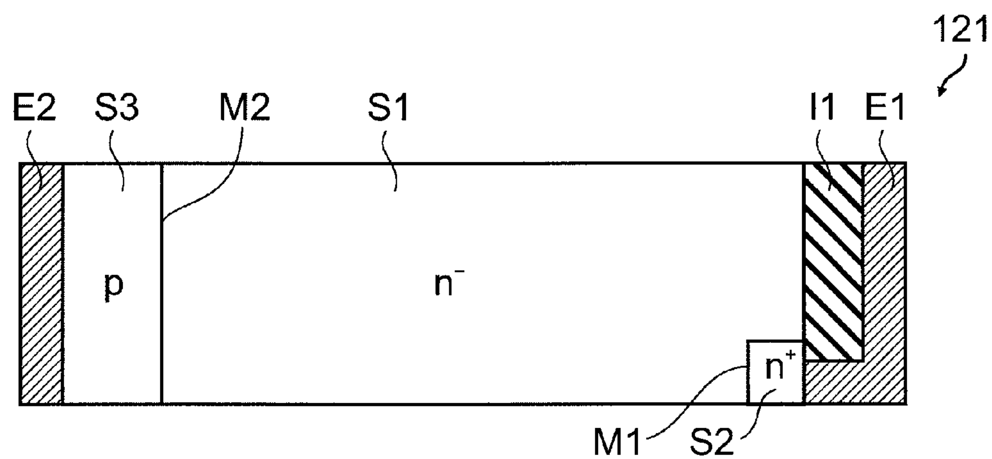
FIGS. 10A and 10B are schematic cross-sectional views illustrating the configuration of alternative semiconductor devices according to the first embodiment of the invention.
Figure 10B:
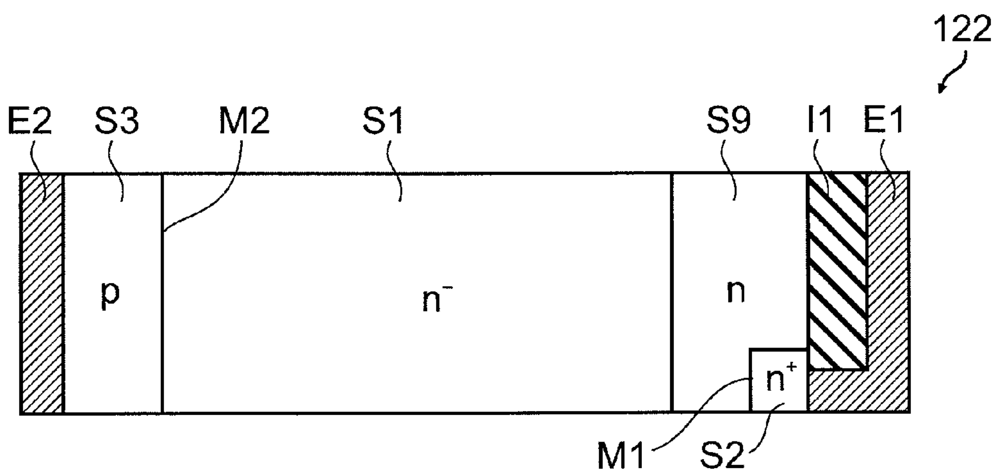

FIGS. 10A and 10B are schematic cross-sectional views illustrating the configuration of alternative semiconductor devices according to the first embodiment of the invention.

As shown in FIG. 10A, in an alternative semiconductor device 121 according to this embodiment, the cathode layer S2 in its entirety has a smaller cross section than the base layer S1. Furthermore, the first insulating layer I1 is provided on the opposite side of the cathode layer S2 from the base layer S1 and exposes at least part of the cathode layer S2. That is, in this example, the first insulating layer I1 is not embedded, but provided on the surface of the base layer S1 and the cathode layer S2 so as to expose at least part of the cathode layer S2 while covering the base layer S1. That is, the surface on the opposite side of the cathode layer S2 (the second semiconductor layer) from the base layer S1 (the first semiconductor layer) has a region being contact with the first insulating layer I1 and a region being contact with the cathode electrode E1 (the first electrode).

Also in the semiconductor device 121 thus configured, the cathode layer S2 has a smaller cross section than the base layer S1. Thus, the semiconductor device 121 can also serve as a semiconductor device with suppressed waveform oscillation and reduced switching loss without adversely affecting other characteristics, such as leakage current.

The semiconductor device 121 can be manufactured illustratively as follows. For instance, first, a $SiO_2$ layer serving as a first insulating layer I1 is formed on the backside, for instance, of an $n^-$-silicon substrate serving as a base layer S1 except on the portion where a cathode layer S2 is to be provided. Subsequently, the first insulating layer I1 is used as a mask to introduce n-type impurities, such as phosphorus (P) and arsenic (As), by diffusion, injection or other process into part of the $n^-$-silicon substrate to form a cathode layer S2. Subsequently, by the method described above, a cathode electrode E1, an anode layer S3, and an anode electrode E2 are formed. Thus, the semiconductor device 121 is fabricated.

Thus, in the configuration of the semiconductor device 121, there is no need for the process of removing part of the base layer S1 and the cathode layer S2, which advantageously facilitates manufacturing.

As shown in FIG. 10B, in an alternative semiconductor device 122 according to this embodiment, the cathode layer S2 in its entirety has a smaller cross section than the base layer S1. Furthermore, the first insulating layer I1 is provided on the surface of the base layer S1 and the cathode layer S2 so as to expose at least part of the cathode layer S2 while covering the base layer S1. Furthermore, the cathode layer S2 and the first insulating layer I1 are separated from the base layer S1 by an n-layer S9 (a middle concentration layer) having a higher impurity concentration than the base layer S1 and a lower impurity concentration than the cathode layer S2. That is, the n-layer S9 is provided between the first semiconductor layer and the first insulating layer and the n-layer S9 contains the first impurities at a concentration higher than the concentration in the first semiconductor layer and lower than the concentration in the second semiconductor layer.

The semiconductor device 122 thus configured can also serve as a semiconductor device with suppressed waveform oscillation and reduced switching loss without adversely affecting other characteristics, such as leakage current.

The semiconductor device 122 can be manufactured by partially modifying the manufacturing method described with reference to the semiconductor device 121. For instance, an n-layer S9 is provided on the first surface M1 side of a base layer S1, and a $SiO_2$ layer serving as a first insulating layer I1 is formed thereon except on the portion where a cathode layer S2 is to be provided. Subsequently, the first insulating layer I1 is used as a mask to introduce n-type impurities, such as phosphorus (P) and arsenic (As), by diffusion, injection or other process into part of the n-layer S9 to form a cathode layer S2. Furthermore, by the method described above, a cathode electrode E1, an anode layer S3, and an anode electrode E2 are formed. Thus, the semiconductor device 122 is fabricated.

Also in the configuration of the semiconductor device 122, there is no need for the process of removing part of the base layer S1, the cathode layer S2, and the n-layer S9, which advantageously facilitates manufacturing.

Figure 11A:
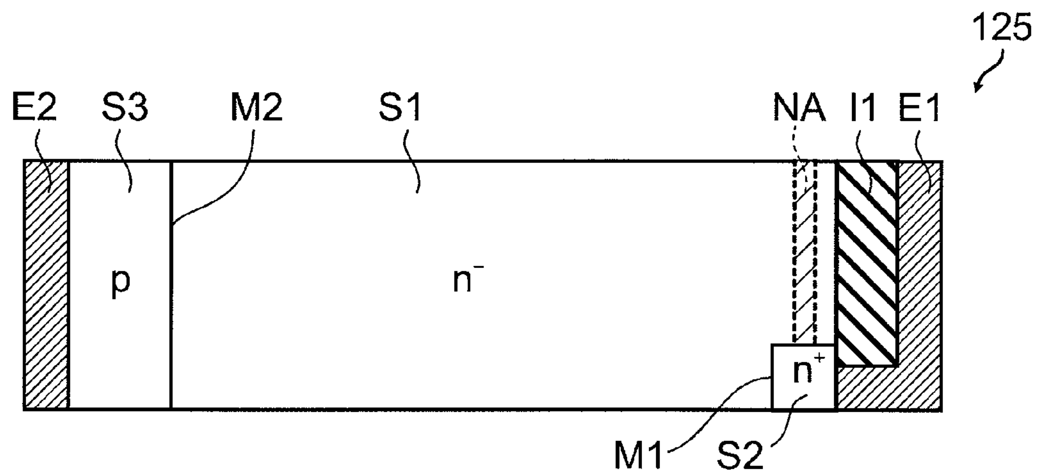
FIGS. 11A and 11B are schematic cross-sectional views illustrating the configuration of alternative semiconductor devices according to the first embodiment of the invention.
Figure 11B:
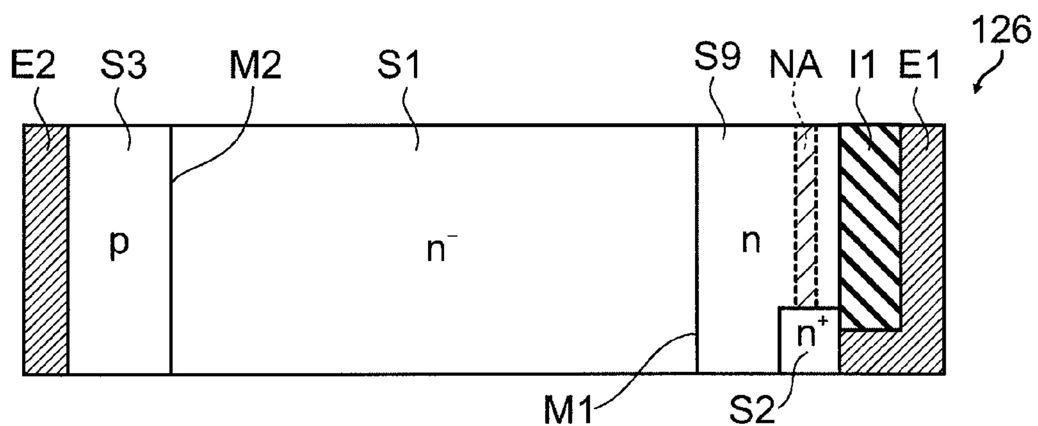

FIGS. 11A and 11B are schematic cross-sectional views illustrating the configuration of alternative semiconductor devices according to the first embodiment of the invention.

As shown in FIG. 11A, the alternative semiconductor device 125 according to this embodiment is the same as the semiconductor device 121 illustrated in FIG. 10A except that an inactive dopant layer NA is provided in a region of the base layer S1 close to the cathode electrode E1. That is, the inactive dopant layer NA which contains inactive dopants is provided in contact with the cathode layer S2 and in a plane parallel to the first surface M1. In this case, the inactive dopant layer NA is provided in the base layer S1 at a position corresponding to the position where the cathode layer S2 is provided, with respect to the direction parallel to the stacking direction. Furthermore, as the case may be, the inactive dopant layer NA is provided at the interface of the base layer S1 with the first insulating layer I1. In such a case, inactive dopant layer NA is in contact with the cathode layer S2.

Such an inactive dopant layer NA can be formed by the following method. After n-type impurities are introduced entirely into the first surface M1 of the $n^-$-silicon substrate serving as a base layer S1, a first insulating layer I1 is selectively provided on the first surface M1, and used as a mask to apply laser radiation thereto. Even if impurities are excessively introduced, the inactive dopant layer NA acts as a lifetime killer. Hence, the switching loss can be further reduced.

As shown in FIG. 11B, the alternative semiconductor device 126 according to this embodiment is the same as the semiconductor device 122 illustrated in FIG. 10B except that an inactive dopant layer NA is provided in a region of the n-layer S9 close to the cathode electrode E1. The inactive dopant layer NA is also provided in contact with the cathode layer S2 and in a plane parallel to the first surface M1. In this case, The inactive dopant layer NA is provided in the n-layer S9 (the middle concentration layer) at a position corresponding to the position where the cathode layer S2 is provided, with respect to the direction parallel to the stacking direction. Furthermore, as the case may be, the inactive dopant layer NA can be provided at the interface of the n-layer S9 with the first insulating layer I1. In such a case, inactive dopant layer NA is in contact with the cathode layer S2.

The semiconductor devices 125 and 126 thus configured can also serve as a semiconductor device with suppressed waveform oscillation and reduced switching loss without adversely affecting other characteristics, such as leakage current.

Figure 12A:
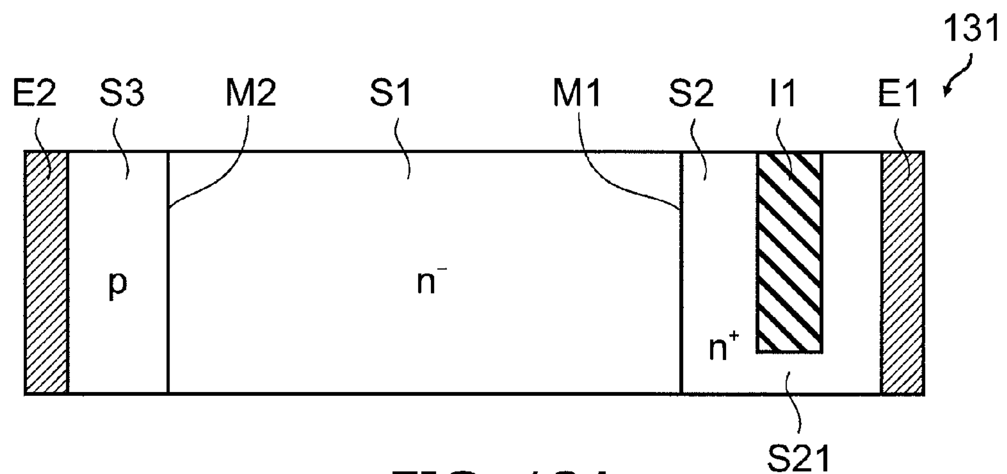
FIGS. 12A to 12C are schematic cross-sectional views illustrating the configuration of alternative semiconductor devices according to the first embodiment of the invention.
Figure 12B:
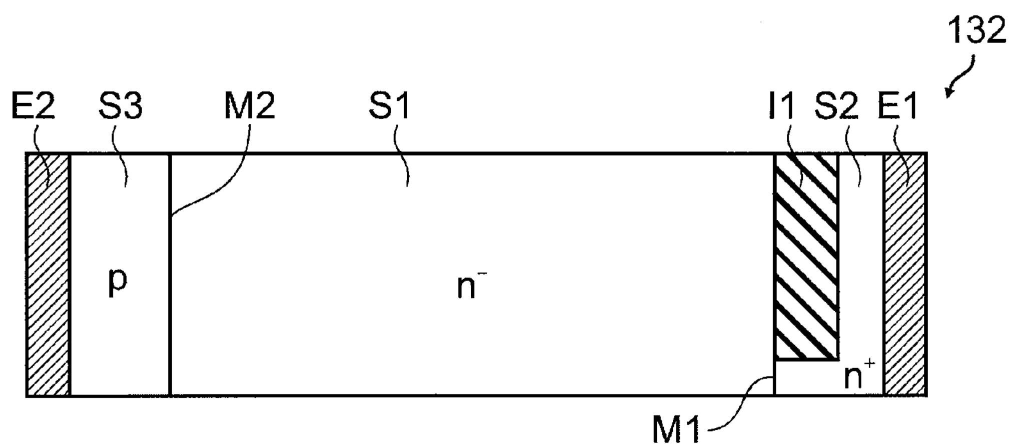
Figure 12C:
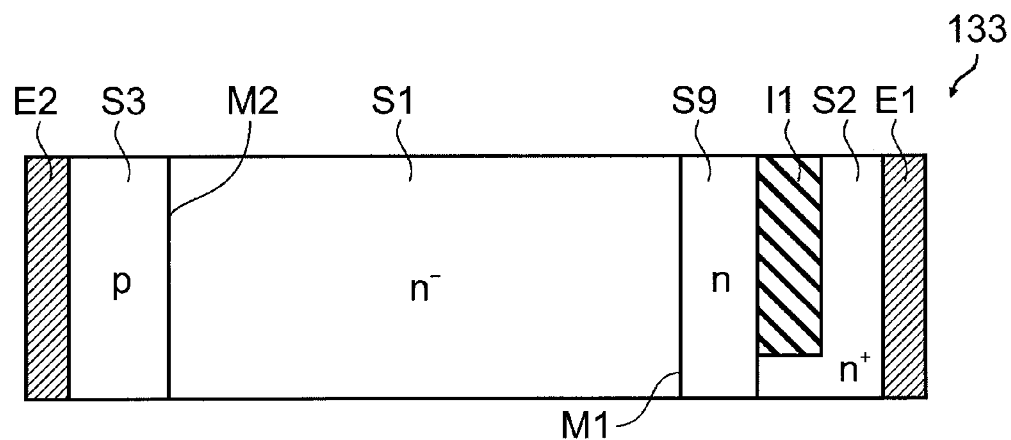

FIGS. 12A to 12C are schematic cross-sectional views illustrating the configuration of alternative semiconductor devices according to the first embodiment of the invention.

As shown in FIG. 12A, in an alternative semiconductor device 131 according to this embodiment, the first insulating layer I1 is embedded inside the cathode layer S2. In this case, in the portion where the first insulating layer I1 is provided, the cathode layer S2 has a smaller cross section than the base layer S1. The first insulating layer I1 is embedded in the portion except the portion S21 having a smaller cross section.

The semiconductor device 131 thus configured can be manufactured illustratively as follows. For instance, first, an $n^+$-layer is formed on the first surface M1 of an $n^-$-silicon substrate serving as a base layer S1 by any of the methods described above. Subsequently, oxygen is injected into the $n^+$-layer through a prescribed mask or the like. Oxygen injected into the $n^+$-layer is combined with silicon in the $n^+$-layer to produce silicon oxide, thereby forming a first insulating layer I1 in the $n^+$-layer. The portion of the $n^+$-layer where oxygen is not injected serves as a cathode layer S2. Here, the position in the $n^+$-layer where oxygen is injected can be controlled by, for instance, the acceleration energy and the like of oxygen ions during oxygen injection. Next, by the method described above, a cathode electrode E1, an anode layer S3, and an anode electrode E2 are formed. Thus, the semiconductor device 131 is fabricated.

As shown in FIG. 12B, in an alternative semiconductor device 132 according to this embodiment, the first insulating layer I1 is selectively provided on part of the first surface M1 side of the base layer S1, and the cathode layer S2 is provided so as to cover the first insulating layer I1. Such a structure can be formed by selectively injecting oxygen into the aforementioned $n^+$-layer serving as a cathode layer S2, or by forming a first insulating layer I1 on the first surface M1 of the base layer S1 by photolithography, for instance, and forming a cathode layer S2 so as to cover the first insulating layer I1 and the base layer S1 exposed from the first insulating layer I1.

As shown in FIG. 12C, the alternative semiconductor device 133 according to this embodiment is the same as the semiconductor device 132 illustrated in FIG. 12B except that the base layer S1 is separated from the first insulating layer I1 and the cathode layer S2 by an n-layer S9. Such a structure can be formed, after providing an n-layer S9 on the first surface M1 side of the base layer S1, by selectively injecting oxygen into the aforementioned $n^+$-layer serving as a cathode layer S2, or by forming a first insulating layer I1 on the n-layer S9 by photolithography, for instance, and forming a cathode layer S2 so as to cover the first insulating layer I1 and the n-layer S9 exposed from the first insulating layer I1.

Also in the semiconductor devices 131, 132, and 133 having such structures, the cathode layer S2 includes a portion having a smaller cross section than the base layer S1. Thus, they can also serve as a semiconductor device with suppressed waveform oscillation and reduced switching loss without adversely affecting other characteristics, such as leakage current.

Figure 13A:
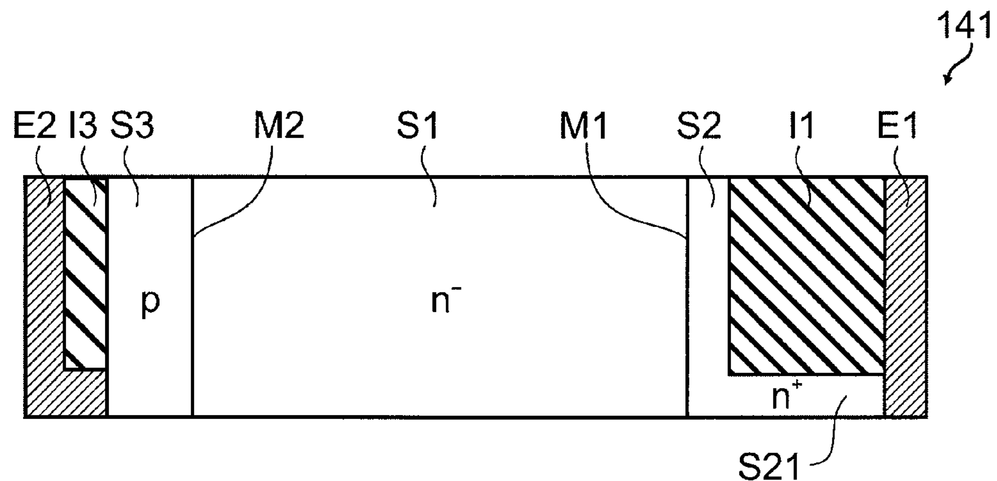
FIGS. 13A and 13B are schematic cross-sectional views illustrating the configuration of alternative semiconductor devices according to the first embodiment of the invention.
Figure 13B:
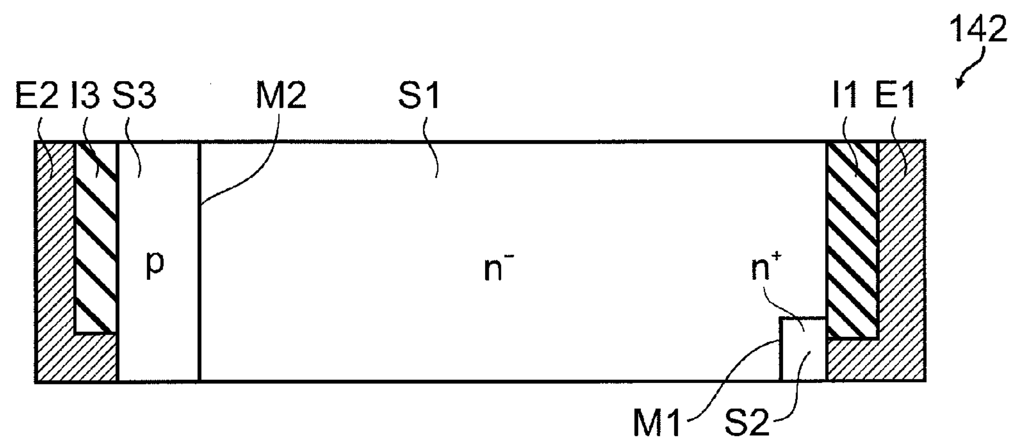

FIGS. 13A and 13B are schematic cross-sectional views illustrating the configuration of alternative semiconductor devices according to the first embodiment of the invention.

As shown in FIG. 13A, the alternative semiconductor device 141 according to this embodiment is the same as the semiconductor device 110 illustrated in FIGS. 1A and 1B except that an insulating layer I3 is selectively provided on the opposite side of the anode layer S3 from the base layer S1. The insulating layer I3 exposes part of the anode layer S3, and the anode electrode E2 is provided so as to cover the insulating layer I3 and the anode layer S3 exposed from the insulating layer I3.

As shown in FIG. 13B, the alternative semiconductor device 142 according to this embodiment is the same as the semiconductor device 121 illustrated in FIG. 10A except that an insulating layer I3 is selectively provided on the opposite side of the anode layer S3 from the base layer S1. The insulating layer I3 exposes part of the anode layer S3, and the anode electrode E2 is provided so as to cover the insulating layer I3 and the anode layer S3 exposed from the insulating layer I3.

Thus, the semiconductor devices 141 and 142 include an insulating layer I3 between a portion of the anode layer S3 and the anode electrode E2 so that the anode layer S3 is in contact with the anode electrode E2 only on the portion of the anode layer S3. Hence, the current flowing through the anode layer S3 can be constricted. More specifically, the base layer S1, the anode layer S3, the insulating layer I3, and the anode electrode E2 are configured so that the insulating layer I3 (i.e., the first insulating layer in this case) is provided between the base layer S1 (i.e., the first semiconductor layer) and the anode electrode E2 (i.e., the first electrode in this case) to constrict the current flowing between the base layer S1 and the anode electrode E2. Furthermore, the anode layer S3 (i.e., the second semiconductor layer in this case) is provided at least on the current path constricted by the insulating layer I3, contains impurities at a concentration higher than the concentration of impurities contained in the base layer S1, and is of p-type (i.e., the first conductivity type in this case). Thus, the first embodiment is applied to the semiconductor devices 141 and 142 with regard to the configuration of the base layer S1, the anode layer S3, the insulating layer I3, and the anode electrode E2.

Thus, in addition to the current constriction effect on the cathode layer S2 side achieved by the portion of the cathode layer S2 having a smaller cross section than the base layer S1, the current constriction effect on the anode layer S3 side is also achieved, and the switching loss can be further reduced.

The semiconductor devices 141 and 142 having such structures can also serve as a semiconductor device with suppressed waveform oscillation and reduced switching loss without adversely affecting other characteristics, such as leakage current.

The structure of the base layer S1, the anode layer S3, the insulating layer I3, and the anode electrode E2 in the semiconductor devices 141 and 142 illustrated in FIGS. 13A and 13B has a configuration similar to that of the structure of the diode parasitically formed in part of a MOSFET. However, they are different in the structure of the semiconductor layer in contact with the electrode and the insulative layer.

Figure 14:
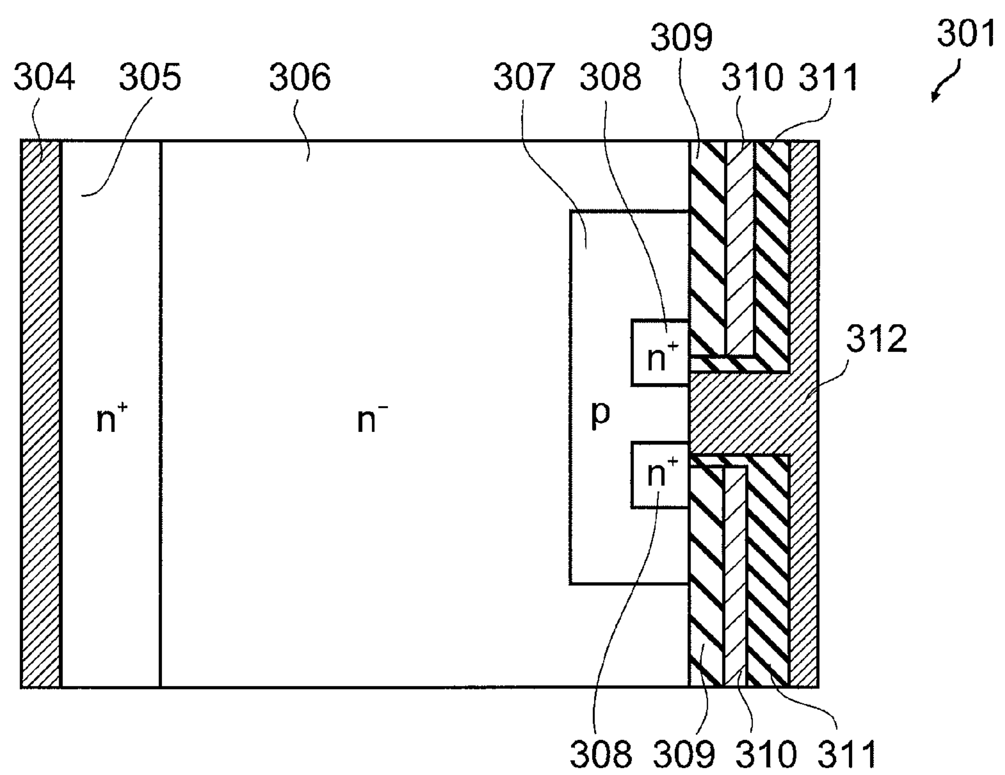
FIG. 14 is a schematic cross-sectional view illustrating the configuration of a semiconductor device of a fourth comparative example.

FIG. 14 is a schematic cross-sectional view illustrating the configuration of a semiconductor device of a fourth comparative example.

The semiconductor device of the fourth comparative example is a MOSFET. As shown in this figure, in the MOSFET 301, for instance, a drain electrode 304, an $n^+$-layer 305, and an $n^-$-layer 306 are stacked. A p-layer 307 is selectively provided in the surface portion of the $n^-$-layer 306. An $n^+$-layer 308 is selectively provided in the surface portion of the p-layer 307. A gate insulating film 309 is provided on the portion of the $n^-$-layer 306 exposed to the surface, the portion of the p-layer 307 exposed to the surface, and part of the $n^+$-layer 308. A gate electrode 310 and an interlayer insulating film 311 are provided on the gate insulating film 309. Further thereon, a source electrode 312 connected to the p-layer 307 and the $n^+$-layer 308 is provided. In the MOSFET 301 thus configured, a diode with the $n^+$-layer 305 serving as a cathode and the p-layer 307 serving as an anode is formed in the path composed of the drain electrode 304, the $n^+$-layer 305, the $n^-$-layer 306, the p-layer 307, and the source electrode 312.

Here, in the MOSFET 301, the source electrode 312 is in contact with both the highly doped p-type semiconductor layer (i.e., p-layer 307) and the highly doped n-type semiconductor layer (i.e., $n^+$-layer 308). Furthermore, the insulative layer including the gate insulating film 309 and the interlayer insulating film 311 is in contact with both the highly doped p-type semiconductor layer (i.e., p-layer 307) and the highly doped n-type semiconductor layer (i.e., $n^+$-layer 308), aside from the low doped $n^-$-layer 306.

In contrast, in the semiconductor devices 141 and 142 illustrated in FIGS. 13A and 13B, the anode electrode E2 is in contact with only the highly doped p-type semiconductor layer (i.e., anode layer S3), and not in contact with the n-type semiconductor layer. Furthermore, the insulating layer I3 is also provided in contact with the highly doped p-type semiconductor layer (i.e., anode layer S3), and is not in contact with the highly doped n-type semiconductor layer. Thus, the semiconductor devices 141 and 142 according to this embodiment differ in structure from the diode formed in the MOSFET 301.

In the above semiconductor devices 115, 121, 125, 131, 132, 141, and 142, the first insulating layer I1 is embedded in the portion of the cathode layer S2 except the portion S21, or provided on the opposite side of the cathode layer S2 from the base layer S1, so as to expose at least part of the cathode layer S2. Thus, the first insulating layer I1 is provided between the base layer S1 and the cathode electrode E1, and hence the base layer S1 and the cathode electrode E1 are not in direct contact with each other. That is, the portion of the cathode layer S2 having a smaller cross section than the base layer S1 serves as a constricted current path between the base layer S1 and the cathode electrode E1.

Likewise, in the above semiconductor devices 116, 122, 126, and 133, the first insulating layer I1 is embedded in the portion of the cathode layer S2 except the portion S21, or provided on the opposite side of the cathode layer S2 from the base layer S1, so as to expose at least part of the cathode layer S2. Thus, the first insulating layer I1 separates the base layer S1 and the n-layer S9 from the cathode electrode E1, and hence the base layer S1 and the n-layer S9 are not in direct contact with the cathode electrode E1. That is, the portion of the cathode layer S2 having a smaller cross section than the base layer S1 serves as a constricted current path between the base layer S1 and the cathode electrode E1.

Furthermore, in the above semiconductor devices 141 and 142, the insulating layer I3 constricts the current flowing between the base layer S1 and the anode electrode E2. That is, the portion of the anode layer S3 corresponding to the opening portion of the insulating layer I3 serves as a constricted current path between the base layer S1 and the anode electrode E2.

Second Embodiment

Figure 15A:
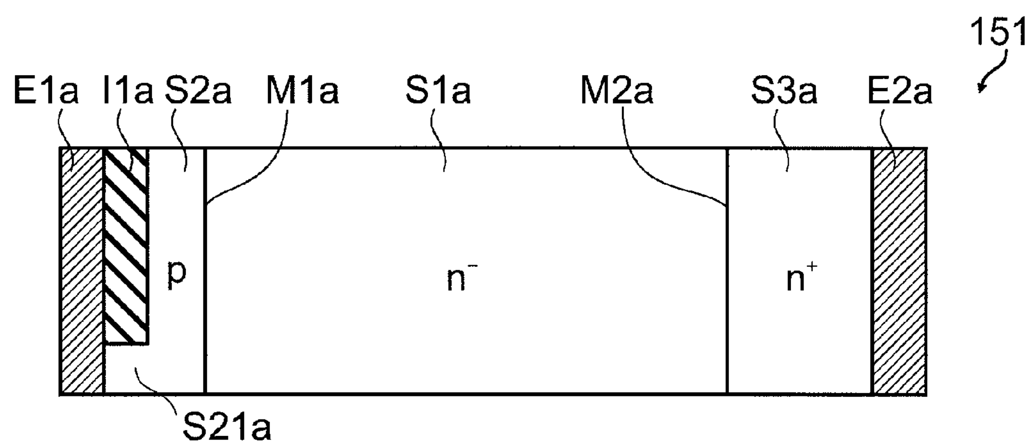
FIGS. 15A and 15B are schematic cross-sectional views illustrating the configuration of semiconductor devices according to a second embodiment of the invention.
Figure 15B:
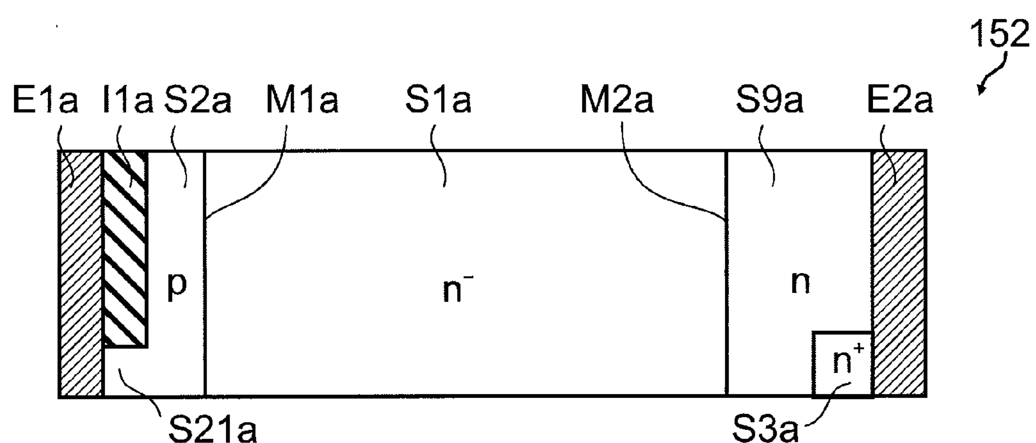

FIGS. 15A and 15B are schematic cross-sectional views illustrating the configuration of semiconductor devices according to a second embodiment of the invention.

More specifically, FIG. 15A illustrates the configuration of a semiconductor device 151 according to this embodiment, and FIG. 15B illustrates the configuration of an alternative semiconductor device 152 according to this embodiment.

As shown in FIG. 15A, the semiconductor device 151 according to the second embodiment of the invention includes a base layer S1*a* (first semiconductor layer), an anode layer S2*a* (second semiconductor layer), a first insulating layer I1*a*, and an anode electrode E1*a* (first electrode).

The anode electrode E1*a* is provided on the first surface M1*a* side of the base layer S1*a*.

The first insulating layer I1*a* is provided between the base layer S1*a* and the anode electrode E1*a* to constrict the current flowing between the base layer S1*a* and the anode electrode E1*a*.

The anode layer S2*a* is provided at least on the current path constricted by the first insulating layer I1*a*, contains impurities at a concentration higher than the concentration of impurities contained in the base layer S1*a*, and has a first conductivity type.

More specifically, the anode layer S2*a* is provided on the first surface M1*a* side of the base layer S1*a*, includes a portion S21*a* whose cross section taken along a plane parallel to the first surface M1*a* is smaller than the cross section of the base layer S1*a*, and contains impurities at a concentration higher than the concentration of impurities contained in the base layer S1*a*. The concentration of impurities contained in the anode layer S2*a* is higher on the anode electrode E1*a* side than on the base layer S1*a* side. In the anode layer S2*a*, the aforementioned portion S21*a* having a smaller cross section than the base layer S1*a* is the current path constricted by the first insulating layer I1*a*.

The anode layer S2*a* has p-type conductivity. Here, it is assumed that p-type conductivity is of the first conductivity type and n-type conductivity is of the second conductivity type. However, in the embodiments of the invention, the first conductivity type and the second conductivity type are interchangeable. In the following description, it is assumed that the first conductivity type is p-type and the second conductivity type is n-type. That is, the anode layer S2*a* is a p-layer.

The base layer S1*a* can be of n-type or p-type irrespective of the conductivity type of the anode layer S2*a*. In the following description, it is assumed that the base layer S1*a* has n-type conductivity, that is, the base layer S1*a* is an $n^-$-layer.

The first insulating layer I1*a* is embedded in the portion of the anode layer S2*a* except the portion S21*a* having a smaller cross section than the base layer S1*a*. However, as described later, the first insulating layer I1*a* is provided in at least one of the state of including a portion embedded in the portion of the anode layer S2*a* except the portion S21*a* having a smaller cross section than the base layer S1*a*, and the state of being provided on the opposite side of the anode layer S2*a* from the base layer S1*a* and exposing at least part of the anode layer S2*a*.

The anode electrode E1*a* is provided on the opposite side of the anode layer S2*a* from the base layer S1*a* and electrically connected to at least part of the anode layer S2*a*.

In this example, the semiconductor device 151 further includes a cathode layer S3*a* (third semiconductor layer) and a cathode electrode E2*a* (second electrode).

The cathode layer S3*a* is provided on the second surface M2*a* side of the base layer S1*a* opposite to the first surface M1*a*, and contains impurities at a concentration higher than the concentration of impurities contained in the base layer S1*a*. The concentration of impurities contained in the cathode layer S3*a* is higher on the cathode electrode E2*a* side than on the base layer S1*a* side. The cathode layer S3*a* has the second conductivity type. That is, in this example, the cathode layer S3*a* has n-type conductivity, and the cathode layer S3*a* is an $n^+$-layer.

The cathode electrode E2*a* is provided on the opposite side of the cathode layer S3*a* from the base layer S1*a* and electrically connected to the cathode layer S3*a*.

The impurity concentration in the anode layer S2*a* is higher than the impurity concentration in the base layer S1*a*. Furthermore, the impurity concentration in the cathode layer S3*a* is higher than the impurity concentration in the base layer S1*a*.

Thus, the semiconductor device 151 according to this embodiment is a PN-type (PIN-type) diode and can be used in various applications like the semiconductor device 110 according to the first embodiment. The components of the semiconductor device 151 can be based on the configuration and material described with reference to the semiconductor device 110, and can be manufactured by suitably modifying the manufacturing method described with reference to the semiconductor device 110.

The semiconductor device 151 according to this embodiment achieves similar effects by similar mechanisms to those of the semiconductor device 110. More specifically, the semiconductor device 151 has a structure in which part of the anode layer S2*a* is removed. Thus, the anode layer S2*a* has a smaller cross section than the base layer S1*a*. Hence, even if the impurity concentration in the anode layer S2*a* is sufficiently increased to achieve good contact, carriers injected and accumulated during high current operation are decreased, and hence the switching loss can be reduced. Furthermore, the waveform oscillation is suppressed during low current operation. Furthermore, the first insulating layer I1*a* is provided in the portion where the anode layer S2*a* is removed. Thus, in the portion where the anode layer S2*a* is removed, the distance between the anode electrode E1*a* and the base layer S1*a* is a certain value or more, and they can be electrically insulated from each other except in the anode layer S2*a* portion. Hence, there is no increase in leakage current.

Thus, the semiconductor device 151 according to this embodiment can serve as a semiconductor device with suppressed waveform oscillation and reduced switching loss without adversely affecting other characteristics, such as leakage current.

Furthermore, as shown in FIG. 15B, the alternative semiconductor device 152 according to this embodiment differs from the semiconductor device 151 in that the structure of the cathode layer S3*a* is modified. More specifically, an n-layer S9*a* is provided on the second surface M2*a* side of the base layer S1*a*, and a cathode layer S3*a* is provided in part of the n-layer S9*a*. Also in this case, the waveform oscillation is suppressed, and the switching loss can be reduced.

That is, any structure in which the anode layer S2*a* has a smaller cross section than the base layer S1*a* and a first insulating layer I1*a* is provided in the remaining portion can serve to suppress waveform oscillation and reduce switching loss without increasing leakage current. Thus, the structure on the cathode layer S3*a* side is arbitrary.

In the above semiconductor devices 151 and 152, the first insulating layer I1*a* is provided between the base layer S1*a* and the anode electrode E1*a* while being embedded in the portion of the anode layer S2*a* except the portion S21*a*. Thus, the base layer S1*a* and the anode electrode E1*a* are not in direct contact with each other. That is, the portion S21*a* of the anode layer S2*a* having a smaller cross section than the base layer S1*a* serves as a constricted current path between the base layer S1*a* and the anode electrode E1*a*.

The semiconductor devices 151 and 152 illustrated in FIGS. 15A and 15B also differ in structure from the diode parasitically formed in part of a MOSFET.

More specifically, in the semiconductor devices 151 and 152, the anode electrode E1*a* is in contact with only the highly doped p-type semiconductor layer (i.e., anode layer S2*a*), and not in contact with the n-type semiconductor layer. Furthermore, the first insulating layer I1*a* is also provided in contact with the highly doped p-type semiconductor layer (i.e., anode layer S2*a*), and is not in contact with the highly doped n-type semiconductor layer. Thus, the semiconductor devices 151 and 152 according to this embodiment differ in structure from the diode formed in the MOSFET 301 illustrated in FIG. 14.

Third Embodiment

Figure 16A:
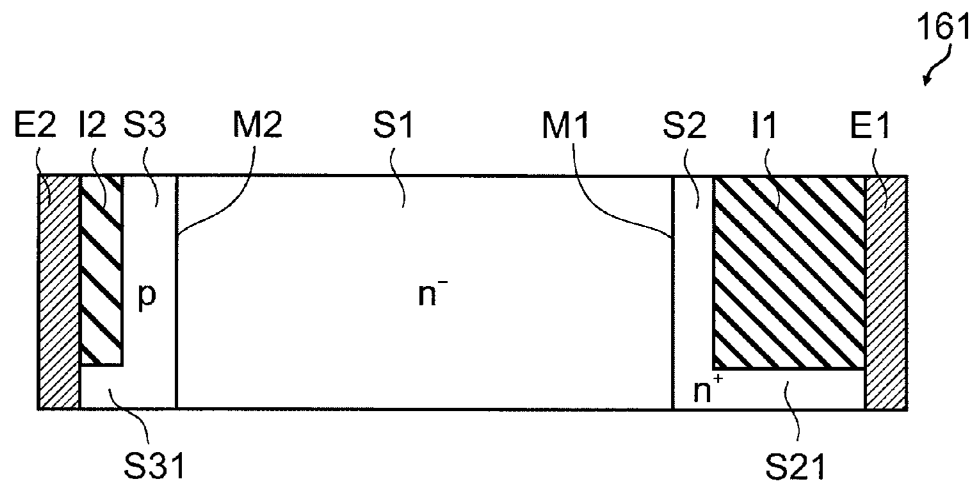
FIGS. 16A and 16B are schematic cross-sectional views illustrating the configuration of semiconductor devices according to a third embodiment of the invention.
Figure 16B:
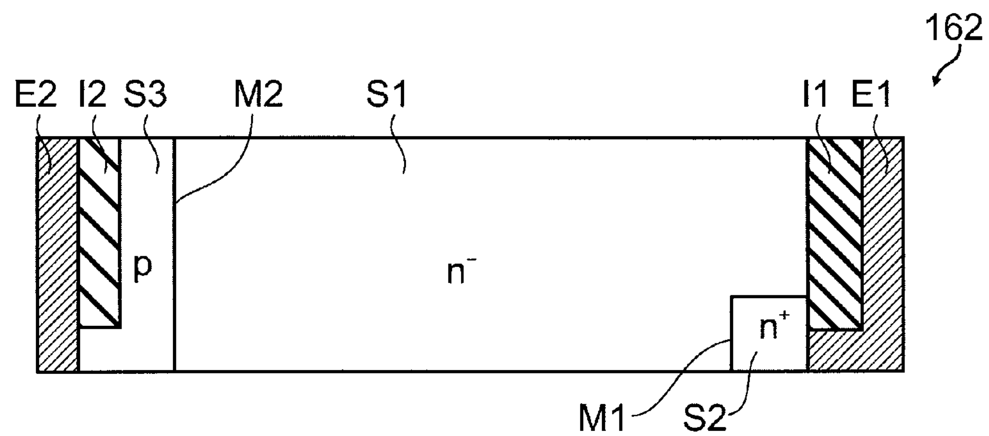

FIGS. 16A and 16B are schematic cross-sectional views illustrating the configuration of semiconductor devices according to a third embodiment of the invention.

More specifically, FIG. 16A illustrates the configuration of a semiconductor device 161 according to this embodiment, and FIG. 16B illustrates the configuration of an alternative semiconductor device 162 according to this embodiment.

As shown in FIG. 16A, the semiconductor device 161 according to the third embodiment of the invention is the same as the semiconductor device 110 according to the first embodiment except that the anode layer S3 has a smaller cross section than the base layer S1. That is, the first embodiment and the second embodiment are combined together.

More specifically, the semiconductor device 161 includes a base layer S1 (first semiconductor layer), a cathode electrode E1 (first electrode) provided on the first surface M1 side of the base layer S1, a first insulating layer I1 provided between the base layer S1 and the cathode electrode E1 to constrict the current flowing between the base layer S1 and the cathode electrode E1, and a cathode layer S2 (second semiconductor layer) of the first conductivity type provided at least on the current path constricted by the first insulating layer I1 and containing impurities at a concentration higher than the concentration of impurities contained in the first semiconductor layer.

The semiconductor device 161 further includes an anode layer S3 (third semiconductor layer) of the second conductivity type provided on the second surface M2 side of the base layer S1 opposite to the first surface M1 and containing impurities at a concentration higher than the concentration of impurities contained in the base layer S1, and an anode electrode E2 (second electrode) provided on the opposite side of the anode layer S3 from the base layer S1 and electrically connected to the anode layer S3.

The semiconductor device 161 further includes a second insulating layer I2 provided between the base layer S1 and the anode electrode E2 to constrict the current flowing between the base layer S1 and the anode electrode E2. The anode layer S3 is provided at least on the current path constricted by the second insulating layer I2.

Thus, the anode layer S3 (third semiconductor layer) at least partly includes a portion S31 whose cross section taken along a plane parallel to the second surface M2 is smaller than the cross section of the base layer S1 (first semiconductor layer). Furthermore, the second insulating layer I2 further included in the semiconductor device 161 includes a portion embedded in the portion of the anode layer S3 except the portion S31 having a smaller cross section than the base layer S1. In the anode layer S3, the aforementioned portion S31 having a smaller cross section than the base layer S1 is the current path constricted by the second insulating layer I2.

As described later, the second insulating layer I2 is provided in at least one of the state of including a portion embedded in the portion of the anode layer S3 except the portion S31 having a smaller cross section than the base layer S1, and the state of being provided on the opposite side of the anode layer S3 from the base layer S1 and exposing at least part of the anode layer S3. That is, the surface on the opposite side of the anode layer S3 (the third semiconductor layer) from the base layer S1 (the first semiconductor layer) has a region being contact with the second insulating layer I2 and a region being contact with the anode electrode E2 (the second electrode).

In this example, both the cathode layer S2 and the anode layer S3 are partly trimmed, and the first insulating layer I1 and the second insulating layer I2 are each embedded in the trimmed portion.

The semiconductor device 161 thus configured can also serve as a semiconductor device with suppressed waveform oscillation and reduced switching loss without adversely affecting other characteristics, such as leakage current.

As shown in FIG. 16B, in an alternative semiconductor device 162 according to this embodiment, part of the anode layer S3 is trimmed, and a second insulating layer I2 is embedded in the trimmed portion. On the other hand, on the cathode layer S2 side, the first insulating layer I1 is provided on the opposite side of the cathode layer S2 from the base layer S1 so as to expose at least part of the cathode layer S2.

The semiconductor device 162 thus configured can also serve as a semiconductor device with suppressed waveform oscillation and reduced switching loss without adversely affecting other characteristics, such as leakage current.

The anode side portion of the semiconductor devices 161 and 162 also differs in structure from the diode parasitically formed in part of a MOSFET.

More specifically, in the semiconductor devices 161 and 162, the anode electrode E2 is provided in contact with only the highly doped p-type semiconductor layer, and is not in contact with the highly doped n-type semiconductor layer. Furthermore, the second insulating layer 12 is also provided in contact with the highly doped p-type semiconductor layer, and is not in contact with the highly doped n-type semiconductor layer.

Figure 17A:
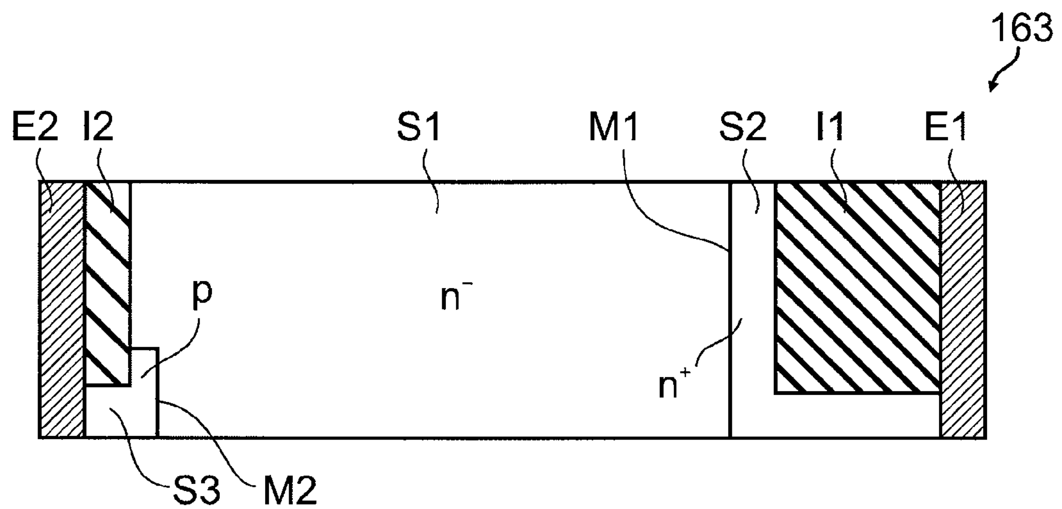
FIGS. 17A and 17B are schematic cross-sectional views illustrating the configuration of alternative semiconductor devices according to the third embodiment of the invention.
Figure 17B:
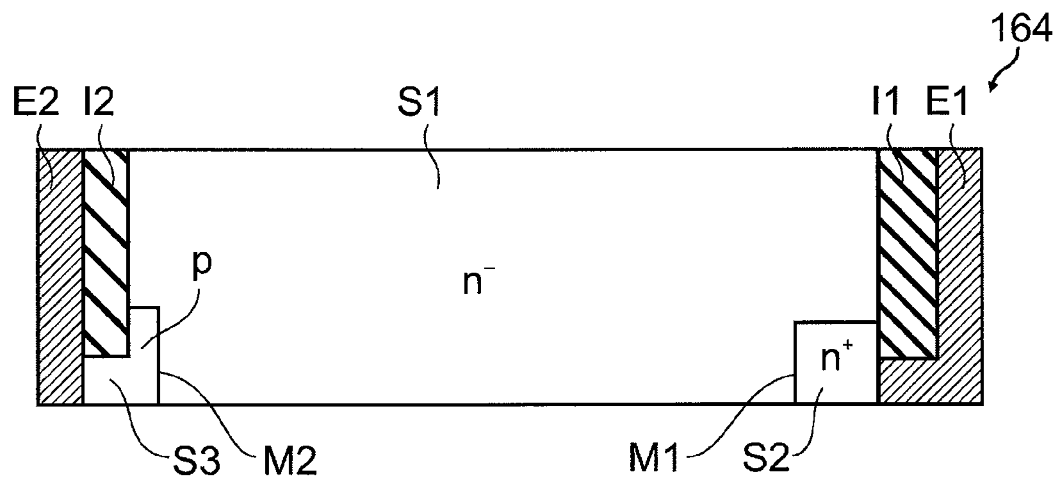

FIGS. 17A and 17B are schematic cross-sectional views illustrating the configuration of alternative semiconductor devices according to the third embodiment of the invention.

As shown in FIG. 17A, in an alternative semiconductor device 163 according to this embodiment, part of the cathode layer S2 is trimmed, and a first insulating layer I1 is embedded in the trimmed portion. On the other hand, on the anode layer S3 side, the second insulating layer I2 is provided on the opposite side of the anode layer S3 from the base layer S1 so as to expose at least part of the anode layer S3.

As shown in FIG. 17B, in an alternative semiconductor device 164 according to this embodiment, on the cathode layer S2 side, the first insulating layer I1 is provided on the opposite side of the cathode layer S2 from the base layer S1 so as to expose at least part of the cathode layer S2. On the other hand, also on the anode layer S3 side, the second insulating layer I2 is provided on the opposite side of the anode layer S3 from the base layer S1 so as to expose at least part of the anode layer S3.

The semiconductor devices 163 and 164 thus configured can also serve as a semiconductor device with suppressed waveform oscillation and reduced switching loss without adversely affecting other characteristics, such as leakage current.

The anode side portion of the semiconductor devices 163 and 164 also differs in structure from the diode parasitically formed in part of a MOSFET.

More specifically, in the semiconductor devices 163 and 164, the anode electrode E2 is provided in contact with only the highly doped p-type semiconductor layer, and is not in contact with the highly doped n-type semiconductor layer. Furthermore, the second insulating layer I2 is provided in contact with the highly doped p-type semiconductor layer, aside from the low doped base layer S1 ($n^-$-layer), and is not in contact with the highly doped n-type semiconductor layer.

In the above semiconductor devices 161, 162, 163, and 164, the first insulating layer I1 is embedded in the portion of the cathode layer S2 except the portion S21, or provided on the opposite side of the cathode layer S2 from the base layer S1, so as to expose at least part of the cathode layer S2. Thus, the first insulating layer I1 is provided between the base layer S1 and the cathode electrode E1, and hence the base layer S1 and the cathode electrode E1 are not in direct contact with each other. That is, the portion of the cathode layer S2 having a smaller cross section than the base layer S1 serves as a constricted current path between the base layer S1 and the cathode electrode E1.

Furthermore, the second insulating layer I2 is embedded in the portion of the anode layer S3 except the portion S31, or provided on the opposite side of the anode layer S3 from the base layer S1, so as to expose at least part of the anode layer S3. Thus, the second insulating layer I2 is provided between the base layer S1 and the anode electrode E2, and hence the base layer S1 and the anode electrode E2 are not in direct contact with each other. That is, the portion of the anode layer S3 having a smaller cross section than the base layer S1 serves as a constricted current path between the base layer S1 and the anode electrode E2.

Fourth Embodiment

The fourth embodiment is an example application of the embodiments of the invention to an IGBT.

Figure 18A:
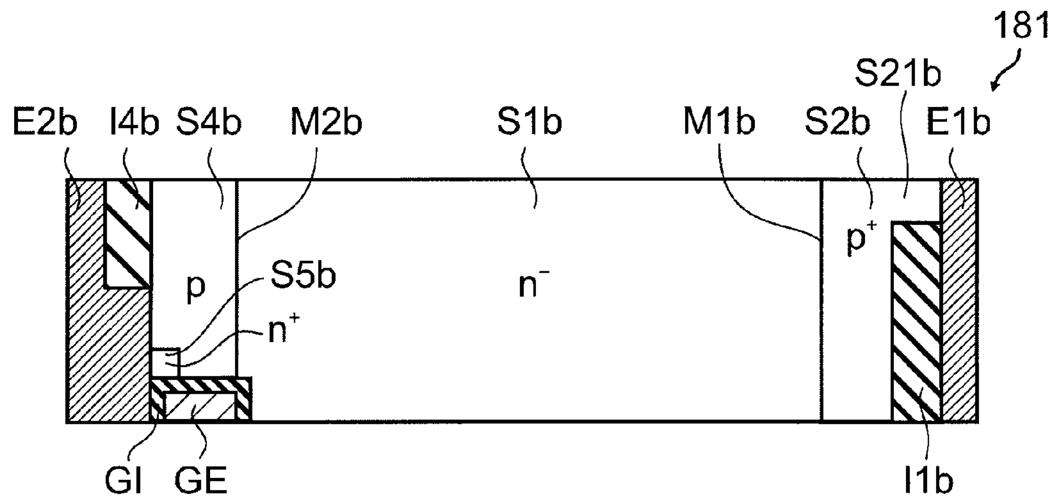
FIGS. 18A and 18B are schematic cross-sectional views illustrating the configuration of semiconductor devices according to the fourth embodiment of the invention.
Figure 18B:
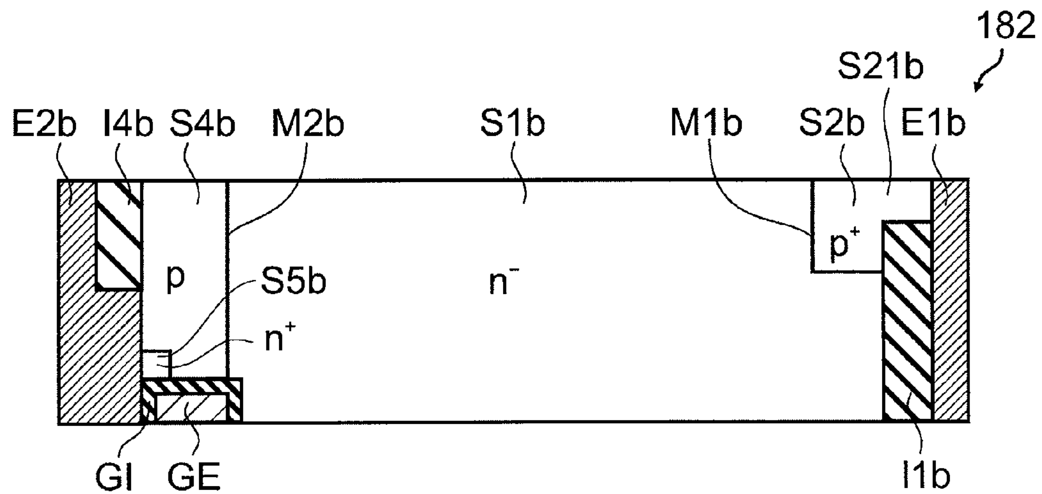

FIGS. 18A and 18B are schematic cross-sectional views illustrating the configuration of semiconductor devices according to the fourth embodiment of the invention.

More specifically, FIG. 18A illustrates the configuration of a semiconductor device 181 according to this embodiment, and FIG. 18B illustrates the configuration of an alternative semiconductor device 182 according to this embodiment. However, these figures illustrate half the structure of one cell of the IGBT according to this embodiment. One cell can include a structure in which the structure illustrated in these figures is turned upside down. Furthermore, an IGBT can include a plurality of cells having such structures.

As shown in FIG. 18A, the semiconductor device 181 according to the fourth embodiment of the invention includes a base layer S1*b* (first semiconductor layer), a collector layer S2*b* (second semiconductor layer), a first insulating layer I1*b*, and a collector electrode E1*b* (first electrode).

The collector electrode E1*b* is provided on the first surface M1*b* side of the base layer S1*b*.

The first insulating layer I1*b* is provided between the base layer S1*b* and the collector electrode E1*b* to constrict the current flowing between the base layer S1*b* and the collector electrode E1*b*.

The collector layer S2*b* is provided at least on the current path constricted by the first insulating layer I1*b*, contains impurities at a concentration higher than the concentration of impurities contained in the base layer S1*b*, and has a first conductivity type.

More specifically, the collector layer S2*b* is provided on the first surface M1*b* side of the base layer S1*b*, at least partly includes a portion S21*b* whose cross section taken along a plane parallel to the first surface M1*b* is smaller than the cross section of the base layer S1*b*, and contains impurities at a concentration higher than the concentration of impurities contained in the base layer S1*b*. In the collector layer S2*b*, the aforementioned portion S21*b* having a smaller cross section than the base layer S1*b* is the current path constricted by the first insulating layer I1*b*.

The collector layer S2*b* has p-type conductivity. Here, it is assumed that p-type conductivity is of the first conductivity type and n-type conductivity is of the second conductivity type. However, in the embodiments of the invention, the first conductivity type and the second conductivity type are interchangeable. In the following description, it is assumed that the first conductivity type is p-type and the second conductivity type is n-type. That is, the collector layer S2*b* is a $p^+$-layer.

In this example, the base layer S1*b* has n-type conductivity. That is, the base layer S1*b* is an $n^-$-layer.

The first insulating layer I1*b* is embedded in the portion of the collector layer S2*b* except the portion S21*b* having a smaller cross section than the base layer S1*b*. However, as described later, the first insulating layer I1*b* is provided in at least one of the state of including a portion embedded in the portion of the collector layer S2*b* except the portion S21*b* having a smaller cross section than the base layer S1*b*, and the state of being provided on the opposite side of the collector layer S2*b* from the base layer S1*b* and exposing at least part of the collector layer S2*b*. In this example, the first insulating layer I1*b* is embedded in the portion of the collector layer S2*b* except the portion S21*b*.

The collector electrode E1*b* is provided on the opposite side of the collector layer S2*b* from the base layer S1*b* and electrically connected to at least part of the collector layer S2*b*.

The semiconductor device 181 further includes an emitter layer S4*b* (fourth semiconductor layer) of the first conductivity type (p-type) provided on the second surface M2*b* side of the base layer S1*b* opposite to the first surface M1*b* and containing impurities at a concentration higher than the concentration of impurities contained in the base layer S1*b*, an $n^+$-layer S5*b* (fifth semiconductor layer) of the second conductivity type provided in the emitter layer S4*b*, a gate electrode GE provided on the emitter layer S4*b* between the base layer S1*b* and the $n^+$-layer S5*b* via a gate insulating film GI, and an emitter electrode E2*b* (second electrode) electrically connected to the emitter layer S4*b*.

That is, in the semiconductor device 181 according to this embodiment, the collector layer S2*b* of the IGBT is partly trimmed, and the first insulating layer I1*b* is embedded in the trimmed portion.

Thus, even if the collector layer S2*b* has a smaller cross section than the base layer S1*b* and the impurity concentration in the collector layer S2*b* is sufficiently increased, carriers injected and accumulated during high current operation are decreased, and hence the switching loss can be reduced. Furthermore, the waveform oscillation is suppressed during low current operation. Furthermore, the first insulating layer I1*b* is provided in the portion where the collector layer S2*b* is removed. Thus, in the portion where the collector layer S2*b* is removed, the distance between the collector electrode E1*b* and the base layer S1*b* is a certain value or more, and they can be electrically insulated from each other except in the collector layer S2*b* portion. Hence, there is no increase in leakage current.

Thus, the semiconductor device 181 according to this embodiment can serve as a semiconductor device, or IGBT, with suppressed waveform oscillation and reduced switching loss without adversely affecting other characteristics, such as leakage current.

In this example, an insulating layer I4*b* is provided on the opposite side of the emitter layer S4*b* from the base layer S1*b*, and the emitter electrode E2*b* is provided so as to cover the emitter layer S4*b* and the insulating layer I4*b*. Thus, part of the emitter electrode E2*b* is in contact with part of the emitter layer S4*b* so that the current path can be constricted. This further decreases accumulated carriers, and can further reduce switching loss.

As shown in FIG. 18B, in an alternative semiconductor device 182 according to this embodiment, the collector layer S2*b* in its entirety has a smaller cross section than the base layer S1*b*. Furthermore, part of the collector layer S2*b* is trimmed, and the collector layer S2*b* includes a portion S21*b* having an even smaller cross section. The first insulating layer I1*b* is embedded in the portion of the collector layer S2*b* except the portion S21*b* having a smaller cross section, and provided in contact with the base layer S1*b* and the collector layer S2*b* so as to expose at least part of the collector layer S2*b*.

The semiconductor device 182 thus configured can also serve as a semiconductor device, or IGBT, with suppressed waveform oscillation and reduced switching loss without adversely affecting other characteristics, such as leakage current.

In the semiconductor devices 181 and 182, the first insulating layer I1*b* is provided between the base layer S1*b* and the collector electrode E1*b* while being embedded in the portion of the collector layer S2*b* except the portion S21*b*. Thus, the base layer S1*b* and the collector electrode E1*b* are not in direct contact with each other.

Figure 19A:
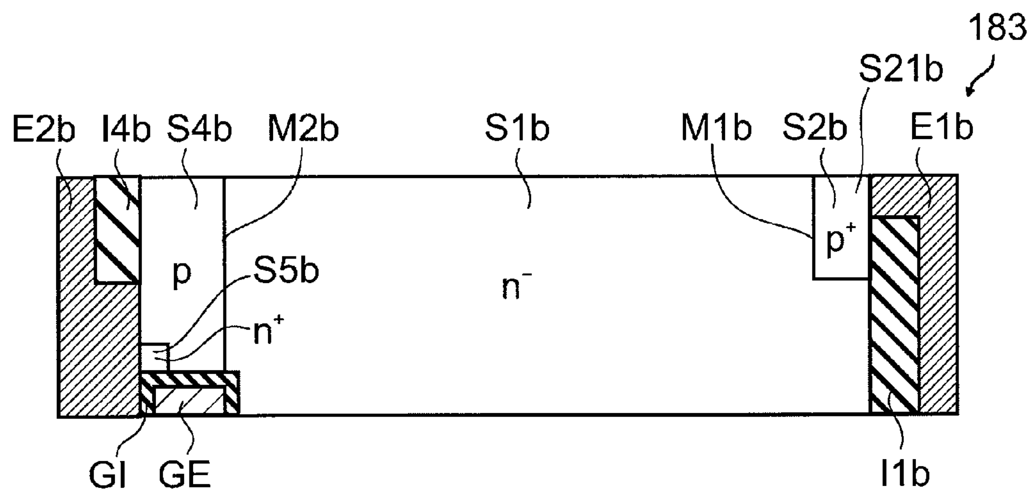
FIGS. 19A to 19C are schematic cross-sectional views illustrating the configuration of alternative semiconductor devices according to the fourth embodiment of the invention.
Figure 19B:
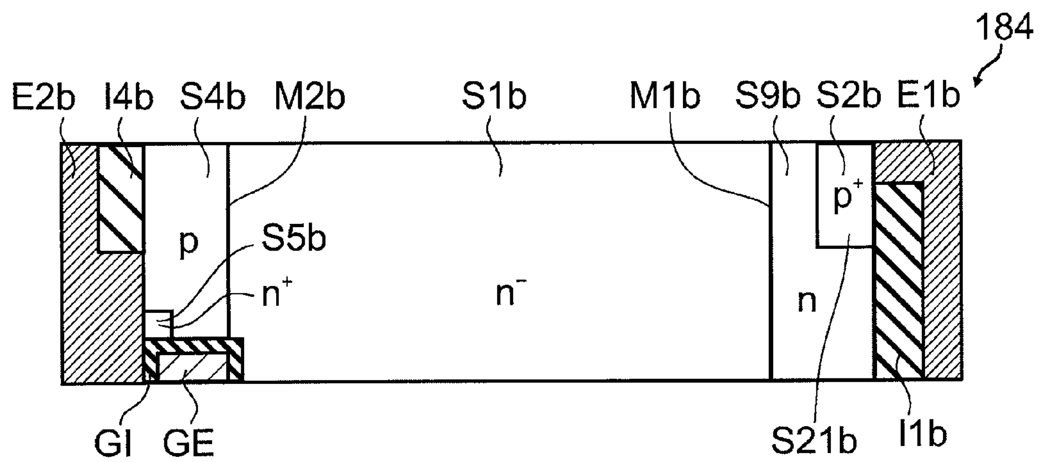
Figure 19C:
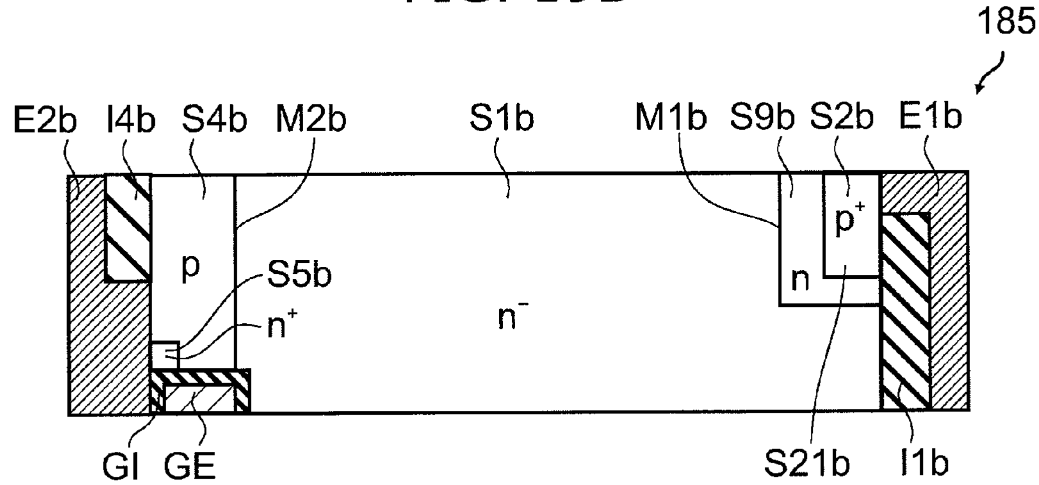

FIGS. 19A to 19C are schematic cross-sectional views illustrating the configuration of alternative semiconductor devices according to the fourth embodiment of the invention.

However, these figures also illustrate half the structure of one cell of the IGBT according to this embodiment. One cell can include a structure in which the structure illustrated in these figures is turned upside down. Furthermore, an IGBT can include a plurality of cells having such structures.

As shown in FIG. 19A, the alternative semiconductor device 183 according to this embodiment includes a collector layer S2*b* having a smaller cross section than the base layer S1*b*. The first insulating layer I1*b* is provided on the opposite side of the collector layer S2*b* from the base layer S1*b* so as to expose at least part of the collector layer S2*b*.

As shown in FIG. 19B, the alternative semiconductor device 184 according to this embodiment includes a collector layer S2*b* having a smaller cross section than the base layer S1*b*. The first insulating layer I1*b* is provided on the opposite side of the collector layer S2*b* from the base layer S1*b* so as to expose at least part of the collector layer S2*b*. Furthermore, an n-layer S9*b* is provided on the first surface M1*b* side of the base layer S1*b*. Part of the n-layer S9*b* is removed, and the collector layer S2*b* is provided in the removed portion.

As shown in FIG. 19C, the alternative semiconductor device 185 according to this embodiment includes a collector layer S2*b* having a smaller cross section than the base layer S1*b*. The first insulating layer I1*b* is provided on the opposite side of the collector layer S2*b* from the base layer S1*b* so as to expose at least part of the collector layer S2*b*. Furthermore, part of the base layer S1*b* on the first surface M1*b* side is removed, an n-layer S9*b* is provided in the removed portion, and the collector layer S2*b* is provided in part of the n-layer S9*b*.

The semiconductor devices 183, 184, and 185 thus configured can also serve as a semiconductor device, or IGBT, with suppressed waveform oscillation and reduced switching loss without adversely affecting other characteristics, such as leakage current.

In the semiconductor devices 181, 182, and 183, the first insulating layer I1*b* is provided on the opposite side of the collector layer S2*b* from the base layer S1*b* so as to separate the base layer S1*b* from the collector electrode E1*b* while exposing at least part of the collector layer S2*b*. Thus, the base layer S1*b* and the collector electrode E1*b* are not in direct contact with each other. That is, the portion of the collector layer S2*b* having a smaller cross section than the base layer S1*b* serves as a constricted current path between the base layer S1*b* and the collector electrode E1*b*.

In the semiconductor devices 184 and 185, the first insulating layer I1*b* is provided on the opposite side of the collector layer S2*b* from the base layer S1*b* so as to separate the base layer S1*b* and the n-layer S9*b* from the collector electrode E1*b* while exposing at least part of the collector layer S2*b*. Thus, the base layer S1*b* and the n-layer S9*b* are not in direct contact with the collector electrode E1*b*. That is, the portion of the collector layer S2*b* having a smaller cross section than the base layer S1*b* serves as a constricted current path between the base layer S1*b* and the collector electrode E1*b*.

In any of the semiconductor devices according to the first to fourth embodiments described above, the first conductivity type and the second conductivity type, that is, p-type and n-type, are interchangeable.

In the embodiments and the variations thereof described above, the impurity concentration of the cathode layer S2, anode layer S3, anode layer S2*a*, cathode layer S3*a*, collector layer S2*b*, emitter layer S4*b*, $n^+$-layer S5*b*, n-layer S9, n-layer S9*a*, and n-layer S9*b* can be varied in a plurality of steps using the configuration as described above with reference to FIGS. 7A and 7B.

The embodiments of the invention have been described with reference to examples. However, the invention is not limited to these examples. For instance, various specific configurations of the components, such as semiconductor layers, insulating layers, and electrodes, constituting the semiconductor device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the semiconductor device described above in the embodiments of the invention, and all the semiconductor devices thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A semiconductor device comprising:

a first semiconductor layer;

a first electrode provided on a first surface side of the first semiconductor layer;

a first insulating layer provided between the first semiconductor layer and the first electrode and configured to constrict current flowing between the first semiconductor layer and the first electrode; and a second semiconductor layer of a first conductivity type provided at least on a path of the current constricted by the first insulating layer and being in contact with the first electrode, the second semiconductor layer containing first impurities at a concentration higher than a concentration of impurities contained in the first semiconductor layer, wherein the second semiconductor layer is provided on the first surface side of the first semiconductor layer and includes a first portion whose cross section taken along a plane parallel to the first surface is smaller than a cross section of the first semiconductor layer and a cross section of the first insulating layer.

2. The device according to claim 1, wherein the concentration of the first impurities contained in the second semiconductor layer is higher on the first electrode side than on the first semiconductor layer side.

3. The device according to claim 1, wherein the concentration of impurities contained in the first semiconductor layer is $1\times10^{12}$-$1\times10^{15}$ $cm^{-3}$.

4. The device according to claim 1, wherein the concentration of the first impurities contained in the second semiconductor layer is $1\times10^{17}$-$1\times10^{19}$ $cm^{-3}$.

5. The device according to claim 1, wherein the concentration of the first impurities on the first electrode side of the second semiconductor layer is $1\times10^{18}$-$1\times10^{19}$ $cm^{-3}$.

6. The device according to claim 1, wherein the first insulating layer is embedded in a portion of the second semiconductor layer except the first portion.

7. The device according to claim 1, wherein the first insulating layer is provided on an opposite side of the second semiconductor layer from the first semiconductor layer and a surface on the opposite side of the second semiconductor layer from the first semiconductor layer has a region being contact with the first insulating layer and a region being contact with the first electrode.

8. The device according to claim 1, further comprising:

a third semiconductor layer of a second conductivity type provided on a second surface side of the first semiconductor layer opposite to the first surface and containing second impurities at a concentration higher than the concentration of impurities contained in the first semiconductor layer; and a second electrode provided on opposite side of the third semiconductor layer from the first semiconductor layer and electrically connected to the third semiconductor layer.

9. The device according to claim 1, further comprising:

a third semiconductor layer of the first conductivity type provided between the first semiconductor layer and the second semiconductor layer and containing impurities at a concentration higher than the concentration of impurities contained in the first semiconductor layer and lower than the concentration of the first impurities contained in the second semiconductor layer.

10. The device according to claim 2, further comprising:

a third semiconductor layer of a second conductivity type provided on a second surface side of the first semiconductor layer opposite to the first surface and containing second impurities at a concentration higher than the concentration of impurities contained in the first semiconductor layer; and a second electrode provided on opposite side of the third semiconductor layer from the first semiconductor layer and electrically connected to the third semiconductor layer, wherein the first insulating layer is provided on an opposite side of the second semiconductor layer from the first semiconductor layer and a surface on the opposite side of the second semiconductor layer from the first semiconductor layer has a region being contact with the first insulating layer and a region being contact with the first electrode, and the first insulating layer is embedded in a portion of the second semiconductor layer except the first portion.

11. The device according to claim 8, further comprising:

a second insulating layer provided between the first semiconductor layer and the second electrode and configured to constrict current flowing between the first semiconductor layer and the second electrode, and the third semiconductor layer being provided at least on a path of the current constricted by the second insulating layer.

12. The device according to claim 11, wherein the third semiconductor layer is provided on the second surface side of the first semiconductor layer opposite to the first surface and includes a second portion whose cross section taken along a plane parallel to the second surface is smaller than a cross section of the first semiconductor layer, and the second insulating layer is embedded in a portion of the third semiconductor layer except the second portion.

13. The device according to claim 11, wherein the second insulating layer is provided on an opposite side of the third semiconductor layer from the first semiconductor layer and a surface on the opposite side of the third semiconductor layer from the first semiconductor layer has a region being contact with the second insulating layer and a region being contact with the second electrode.

14. The device according to claim 11, wherein the second insulating layer is not in contact with a semiconductor layer of the first conductivity type containing impurities at a concentration higher than the concentration of impurities contained in the first semiconductor layer.

15. The device according to claim 11, wherein the concentration of the second impurities contained in the third semiconductor layer is higher on the second electrode side than on the first semiconductor layer side.

16. The device according to claim 11, wherein the concentration of the second impurities contained in the third semiconductor layer is $1\times10^{17}$-$1\times10^{19}$ $cm^{-3}$ and/or the concentration of the second impurities on the second electrode side of the third semiconductor layer is $1\times10^{18}$-$1\times10^{19}$ $cm^{-3}$.

17. A semiconductor device comprising:

a first semiconductor layer, the first semiconductor layer having a second conductivity type;

a first electrode provided on a first surface side of the first semiconductor layer;

a first insulating layer provided between the first semiconductor layer and the first electrode and configured to constrict current flowing between the first semiconductor layer and the first electrode;

a second semiconductor layer of a first conductivity type provided at least on a path of the current constricted by the first insulating layer and being in contact with the first electrode, the second semiconductor layer containing first impurities at a concentration higher than a concentration of impurities contained in the first semiconductor layer;

a third semiconductor layer of the first conductivity type provided on a second surface side of the first semiconductor layer opposite to the first surface and containing impurities at a concentration higher than the concentration of impurities contained in the first semiconductor layer;

a fourth semiconductor layer of the second conductivity type provided in the third semiconductor layer;

a gate electrode provided on the third semiconductor layer between the first semiconductor layer and the fourth semiconductor layer via a gate insulating film; and a second electrode electrically connected to the third semiconductor layer, wherein the second semiconductor layer is provided on the first surface side of the first semiconductor layer and includes a first portion whose cross section taken along a plane parallel to the first surface is smaller than a cross section of the first insulating layer.

18. The device according to claim 17, wherein the first insulating layer is embedded in a portion of the second semiconductor layer except the first portion.

a third semiconductor layer of the first conductivity type provided between the first semiconductor layer and the second semiconductor layer and containing impurities at a concentration higher than the concentration of impurities contained in the first semiconductor layer and lower than the concentration of the first impurities contained in the second semiconductor layer.

19. A semiconductor device comprising:

a first semiconductor layer;

a first electrode provided on a first surface side of the first semiconductor layer;

a first insulating layer provided between the first semiconductor layer and the first electrode and configured to constrict current flowing between the first semiconductor layer and the first electrode; and a second semiconductor layer of a first conductivity type provided at least on a path of the current constricted by the first insulating layer and being in contact with the first electrode, the second semiconductor layer containing first impurities at a concentration higher than a concentration of impurities contained in the first semiconductor layer, wherein an inactive dopant layer which contains inactive dopants is provided in contact with the second semiconductor layer and in a plane parallel to the first surface.

20. The device according to claim 19, wherein the inactive dopant layer is provided in the first semiconductor layer.

21. The device according to claim 19, further comprising a middle concentration layer provided between the first semiconductor layer and the first insulating layer and containing the first impurities at a concentration higher than the concentration in the first semiconductor layer and lower than the concentration in the second semiconductor layer, wherein the inactive dopant layer is provided in the middle concentration layer.

* * * * *